United States Patent
Nahas

(10) Patent No.: US 7,266,486 B2
(45) Date of Patent: Sep. 4, 2007

(54) MAGNETORESISTIVE RANDOM ACCESS MEMORY SIMULATION

(75) Inventor: Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 194 days.

(21) Appl. No.: 10/806,612

(22) Filed: Mar. 23, 2004

(65) Prior Publication Data

US 2005/0216244 A1 Sep. 29, 2005

(51) Int. Cl.
G06F 17/50 (2006.01)
F06G 7/62 (2006.01)
(52) U.S. Cl. ...................................... 703/13
(58) Field of Classification Search ................. 257/43; 365/158, 171, 173, 210, 211, 225.5; 703/5, 703/7, 13
See application file for complete search history.

(56) References Cited

U.S. PATENT DOCUMENTS

| 5,867,405 A | 2/1999 | Jiang et al. | |
|---|---|---|---|
| 6,545,906 B1 * | 4/2003 | Savtchenko et al. | 365/158 |
| 2002/0141232 A1 | 10/2002 | Saito et al. | |

OTHER PUBLICATIONS

Kim et al., Macro Model and Sense Amplifier for a MRAM, Dec. 2002, Journal of the Korean Physical Society, vol. 41, No. 6, pp. 896-901.*
Bodhisattva Das and William C. Black, A Generalized HSPICE Macro-Model for Pinned Spin-Dependent-Tunneling Devices, Sep. 1999, IEEE Transactions On Magnetics, vol. 35, No. 5, pp. 2889-2891.*
Maxim et al., A Novel Behavioral Method of SPICE Macromodeling of Magnetic Components Including the Temperature and Frequency Dependencies. 1998, IEEE 0-7803-4340-Sep. 1998, pp. 393-399.*
Reiss et al., Spinelectronics And Its Applications, Published Online Mar. 3, 2003, Physica Status Solidi (b), vol. 236, Issue 2, pp. 289-302.*
Theodoros Dimopoulos, Transport Polarisé En Spin Dans Les Jontions Tunnel Magnétiques: Le Rôle Des Interfaces Métal/Oxyde Dans Le Processus Tunnel, Jan. 11, 2002, Thesis, Institut de Physique et Chimie des Matériaux de Strasbourg, pp. 146, 152-154, 160, 161.*
Peter Lancaster and Kestutis Salkauskas, Curve And Surface Fitting: An Introduction, 1990, Academic Press Ltd., pp. 44, 45.*
Das et al., Universal HSPICE Macromodel For Giant Magnetoresistance Memory Bits, Jul. 2000, IEEE Transactions on Magnetics, vol. 36, No. 4, pp. 2062-2072.*

(Continued)

Primary Examiner—Paul Rodriguez
Assistant Examiner—Juan Carlos Ochoa
(74) Attorney, Agent, or Firm—David G. Dolezal; Robert L. King; Ranjeev Singh

(57) ABSTRACT

A computer model simulation for an MRAM cell. In one example, the MRAM cell includes a magnetic tunnel junctions (MTJ) with multiple free magnetic layers. In one embodiment, the simulation implements a state machine whose states variables transition based on indications of magnetic fields passing thresholds. In one embodiment, the conductance values utilized from the model are derived from measured data that is curve fitted to obtain first and second order polynomial coefficient parameters to be used in the model.

11 Claims, 15 Drawing Sheets

OTHER PUBLICATIONS

Bae et al., "Fabrication and Thermal-Chemical Stability of Magnetoresistive Random-Access Memory Cells Using $\alpha\text{-Fe}_2\text{O}_3$ Bottom Spin Values," *IEEE Transactions on Magnetics*, vol. 37, No. 6, Nov. 2001, pp. 3960-3968.

Cheung, "'Direct Charging' Charge Device Model Testing of Magnetoresistive Recording Heads," *EOS/ESD Symposium* 97-398, 1997, pp. 398-404.

M. Durlam, et al., "A Low Power 1Mbit MRAM Based on 1T1MTJ Bit Cell Integrated with Copper Interconnects," *Symposium on VLSI Circuits Digest of Technical Papers*, 2002, pp. 158-161.

B. A. Everitt et al., "Single-Domain Model for Pseudo Spin Valve MRAM Cells," *IEEE Transactions on Magnetics*, Sep. 1997, p. 3289-3291, vol. 33, No. 5.

P. K. George et al., "Head Parameter Sensitivity Study of the Intrinsic Field Reversal Time," *Journal of Applied Physics*, Apr. 15, 1999, p. 4979-4981, vol. 85, No. 8.

J. Mahdavi et al., "Dynamic Modeling of Non-Linear SRM Drive with PSPICE," *IEEE Industry Applications Society Annual Meeting*, New Orleans, Louisiana, Oct. 5-9, 1997, pp. 661-667.

A. Maxim et al., "A New Analog Behavioral SPICE Macromodel of Magnetic Components," *IEEE International Symposium on Industrial Electronics*, Guimarãs, Portugal, University of Minho, Jul. 7-11, 1997, pp. 183-188, vol. 2 of 3.

A. Maxim et al., "A Novel Behavioral Method of SPICE Macromodeling of Magnetic Components Including the Temperature and Frequency Dependencies," *IEEE Power Electronics Conference*, 1998, pp. 393-399.

T. Sugawara et al., "A Nonlinear Model for Magnetic Recording Channel with an MR Head," *IEEE Transactions on Magnetics*, Jan. 1998, p. 57-62, vol. 34, No. 1.

A. Wallash, "Field-Induced Charged Device Model Testing of Magnetoresistive Recording Heads," *EOS/ESD Symposium*, 1996, pp. 8-13.

A. Wallash et al., "ESD Evaluation of Tunneling Magnetoresistive (TMR) Devices," *EOS/ESD Symposium*, 2000, pp. 470-474.

U.S. Appl. No. 10/302,203, filed Nov. 22, 2002, entitled "Method and Apparatus for Simulating a Magnetoresistive Random Access Memory (MRAM)", assignee same as assignee hereof.

* cited by examiner

MAGNETORESISTIVE RANDOM ACCESS MEMORY SIMULATION

BACKGROUND OF THE INVENTION

1. Field of the Invention

This invention relates in general to circuit simulations and more particularly to simulating magnetoresistive random access memories (MRAMs).

2. Description of the Related Art

Computer simulation models have been built for MRAM magnetic tunnel junctions (MTJ) of MRAM memories. One such example is given in a patent application entitled "Method and Apparatus for Simulating a Magnetorsistive Random Access Memory (MRAM), having an inventor Joseph J. Nahas, having a filing date of Nov. 22, 2002, having a U.S. patent application Ser. No. of 10/302,203, and having a common assignee, all of which is incorporated by reference in its entirety.

One type of MRAM MTJ is disclosed in U.S. Pat. No. 6,545,906, which is incorporated by reference in its entirety. The MTJ disclosed in this patent utilizes multiple free magnetic layers to achieve a cell that toggles between states when subjected to a sequence of magnetic pulses along two directions.

What is needed is a simulation model for MRAM cells with multiple free layers.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

One embodiment of the present invention relates to a computer simulation model for simulating an MRAM memory cell having an MTJ with multiple free magnetic layers (free layers). In one embodiment, the simulation model implements a state machine for simulation of the switching states of an MTJ.

Figure 1:
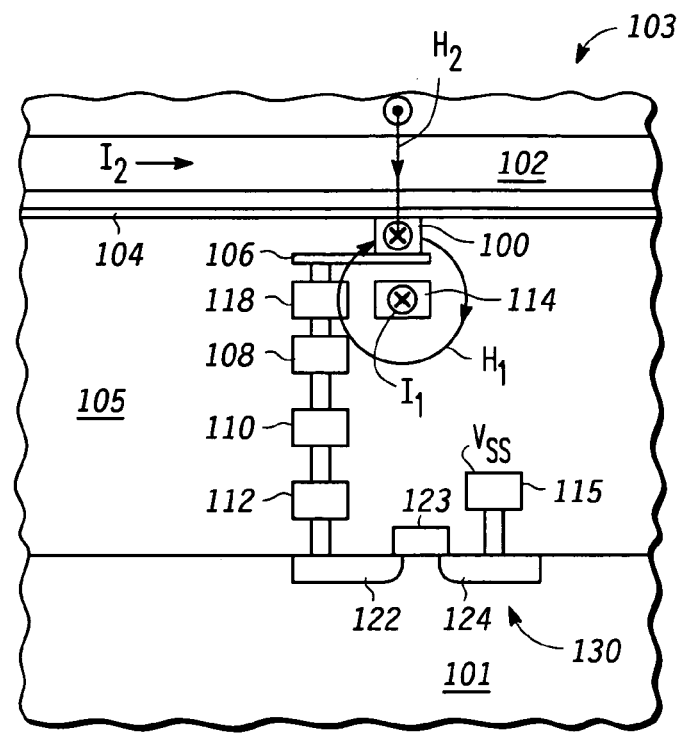
FIG. 1 is a cross-sectional view of one embodiment of an MRAM memory cell having multiple free magnetic layers.
Figure 3:
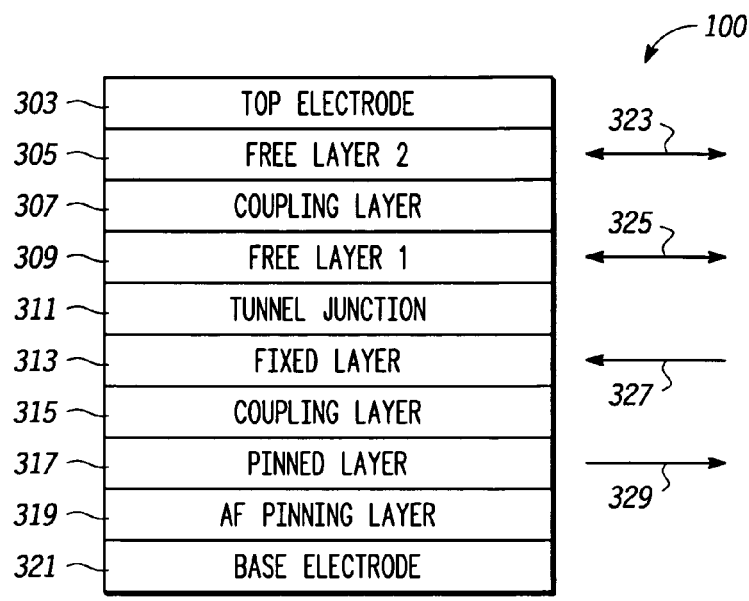
FIG. 3 is a cross sectional view of one embodiment of an MTJ.

FIG. 1 illustrates a cross-sectional view of one embodiment of an MRAM memory cell 103 with an MTJ 100 having multiple free magnetic layers (e.g. free layers 305 and 309 of FIG. 3). Memory cell 103 includes a metal line 102 and a metal line 104, running parallel to first metal line 102. As illustrated in FIG. 1, an insulator layer is present between metal line 102 and metal line 104. In one embodiment, metal line 102 and metal line 104 may be of different materials. In alternate embodiments, metal line 102 and metal line 104 may be implemented as one line.

Memory cell 103 has an MTJ 100 connected to metal line 104 and a metal line 106, located below MTJ 100. Also below MTJ 100, but electrically isolated from MTJ 100, is a metal line 114 which runs substantially perpendicular to metal line 102. In the embodiment shown, MTJ 100 is located between substantially orthogonal metal lines 102 and 114.

In the embodiment shown, memory cell 103 includes a transistor 130 formed within substrate 101. Transistor 130 includes a current electrode 122 and a current electrode 124, both formed in substrate 101, and a control electrode (gate 123) overlying substrate 101. Metal line 106 is coupled to first current electrode 122 of transistor 130 by interconnect 118, interconnect 108, interconnect 110, and interconnect 112. Current electrode 124 is coupled to an interconnect 115, which, in the current embodiment, is coupled to Vss. In the embodiment shown, MTJ 100, metal line 106, interconnects 118, 108, 110, 112, and 115, and metal line 114 are all formed within an interconnect region 105 located between substrate 101 and metal line 104.

A current (e.g. $I_1$, which is shown as going into the page in FIG. 1) applied to line 114 (Axis 1) below MTJ 100 generates a magnetic field ($H_1$) at MTJ 100 perpendicular to the direction of the current according to the "right hand rule". Like wise, a current ($I_2$) applied to line 102 above MTJ 100 generates a magnetic field ($H_2$) at MTJ 100 (which at MTJ 100 is going into the page in FIG. 1). The strength of the magnetic fields at MTJ 100 are dependent on a number of factors including the spacing between metal lines 102 and 114 and MTJ 100, the width of metal lines 102 and 114, the materials in metal lines 102 and 114, and the structure of MTJ 100.

Figure 2:
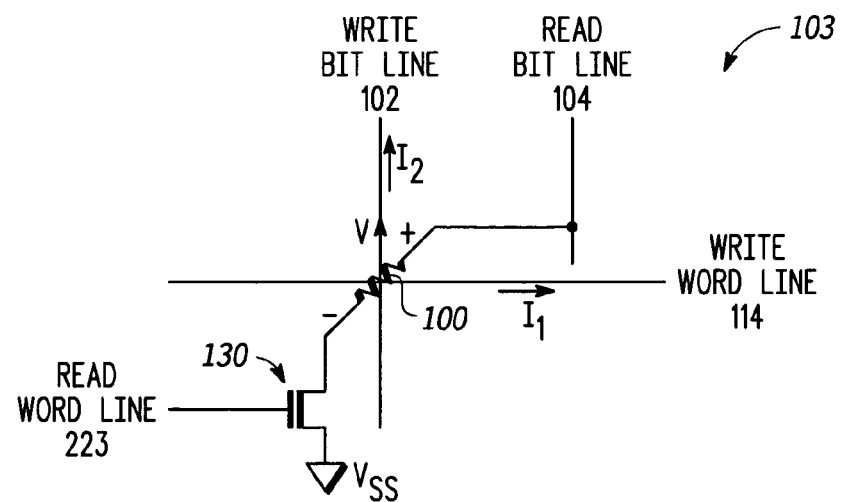
FIG. 2 is a schematic representation of one embodiment of an MRAM memory cell.

FIG. 2 is a schematic representation of memory cell 103. In the embodiment shown, metal line 102 is utilized as a write bit line 102, metal line 104 is utilized as a read bit line 104, metal line 114 is utilized as a write word line 114, and gate 123 of transistor 130 is connected to read word line 223. Transistor 130 is coupled between Vss and MTJ 100. MTJ 100 is represented in FIG. 2 as a resistor.

In one embodiment, cell 103 is located in an array of MRAM cells, where write bit line 102, write word line 114, read bit line 104, and read word line 223 extend to other cells of the array.

FIG. 3 is a cross sectional view of one embodiment of MTJ 100. MTJ 100 is made up of a number of layers. Top electrode 303 is in electrical contact with metal line 104 and bottom electrode 321 is in electrical contact with metal line 106. Free magnetic layers (free layers) 305 and 309, fixed layer 313, pinned layer 317, and AF pinning layer 319 are made of magnetic materials. MTJ 100 includes a tunnel junction dielectric 311 (e.g. made of aluminum oxide) between fixed layer 313 and free layer 309. Free layers 305 and 309 and coupling layer 307 (e.g. made of ruthium) form a first synthetic antiferromagnet. Fixed layer 313, coupling layer 315, and pinned layer 317 form a second synthetic antiferromagnet.

As shown by lines 323 and 325, the magnetic field of free layers 305 and 309 can be polarized in a number of directions depending upon the current flowing through metal lines 102 and 114. As shown by arrow 329, the magnetic polarization of pinned layer 317 is fixed in one direction. Also shown by arrow 327, the magnetic polarization of fixed layer 313 is fixed in another direction, opposite the direction of the magnetic polarization of pinned layer 317. In other embodiments, MTJs may have other configurations and/or may be made of other materials.

Referring back to FIG. 2, the resistive value of MTJ 100 is indicative of the bit state stored in cell 103. To read the bit state stored in cell 103, a voltage is applied to read bit line 104 and read word line 223. The resistive value of MTJ is then measured by a sense amplifier (not shown). The resistive value of MTJ 100 is dependent upon the direction of the magnetic polarization of free layers 305 and 309 of MTJ 100.

Figure 4:
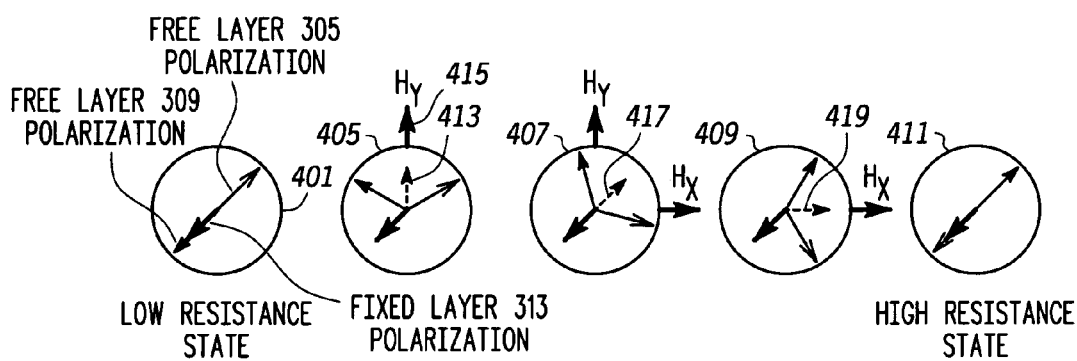
FIG. 4 shows a set of polarization diagrams illustrating one embodiment how the polarization of the free layers are affected by magnetic fields applied to a MTJ during a write cycle.

FIG. 4 shows a set of polarization diagrams illustrating how the polarization of the free layers 305 and 309 are affected by magnetic fields applied to MTJ 100 during a write cycle of MTJ 100. Magnetic fields are applied to MTJ 100 by applying voltages to metal lines 102 and 114 which generate currents in those lines. The magnetic fields rotate the polarity of layers 305 and 309 to write a bit value in MTJ 100. Metal lines 114 and 102 are in one embodiment, simple resistive metal lines with simple linear current-voltage characteristics as shown below:

$$I_1 = G_1 V_1 \quad (1)$$

and $$I_2 = G_2 V_2 \quad (2)$$

where $I_1$ is the current through line 114, $G_1$ is the conductance of line 114 in cell 103, and $V_1$ is the voltage across line 114 in cell 103. $I_2$ is the current through line 102, $G_2$ is the conductance of line 102 in cell 103, and $V_2$ is the voltage across line 102 in cell 103.

In some embodiments, there is a linear relationship between the current in a write line (e.g. 102 and 114) and the magnetic field generated at the MTJ by that current. The relationships can be written as:

$$H_1 = K_1 I_1 \quad (3)$$

and $$H_2 = K_2 I_2 \quad (4)$$

where $H_1$ is the magnetic field at MTJ 100 generated by a current flowing through line 114, $K_1$ is the relationship between the current in line 114 and the magnetic field the current generates, $H_2$ is the magnetic field at MTJ 100 generated by a current flowing through line 102, and $K_2$ is the relationship between the current in line 102 and the magnetic field that current generates. In one embodiments, the write currents through lines 102 and 114 are on the order of 10 to 20 mA and the K's are on the order of 5 to 10 Oe/mA.

As shown in FIG. 4, polarization diagrams 401 405, 407, 409, and 411 each include 3 arrows to show the magnetic polarization of fixed layer 313, the magnetic polarization of free layer 305, and the magnetic polarization of free layer 309 during a write cycle.

Figure 5:
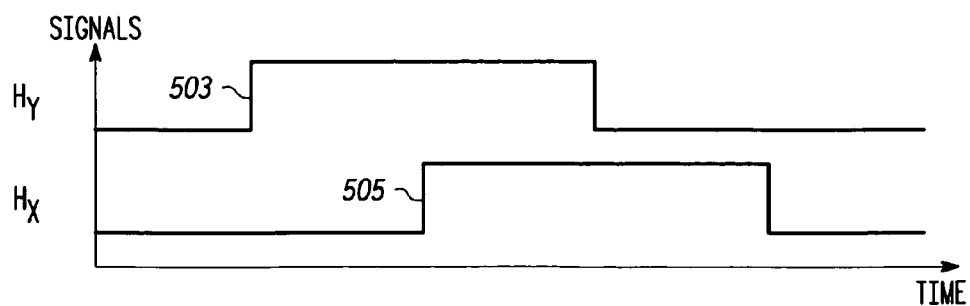
FIG. 5 shows one embodiment of the magnitude of magnetic fields applied to a MTJ in the X and Y directions by applying current to write lines during a write cycle.

FIG. 5 shows the magnitude of magnetic fields applied to MTJ 100 in the X (represented by 505) and & Y (represented by 503) directions by applying current to lines 102 and 114 during a write cycle. Applying current through one of lines 102 and 114 generates a magnetic field ($H_y$) in the Y direction and applying current through the other of lines 102 and 114 generations a magnetic field ($H_x$) in the X direction. The X and Y directions are in the same plane as $H_1$ and $H_2$ in FIG. 2. The timing of $H_y$ and $H_x$ during one example of a write cycle as illustrated in the polarization diagrams of FIG. 4 is shown in FIG. 5.

Referring back to FIG. 4, polarization diagram 401 shows the polarizations of fixed layer 313, free layer 305, and free layer 309 when MTJ 100 is in a low resistance state. At the start of a write cycle of cell 103, the polarization of free layer 309 is parallel to the polarization of fixed layer 313 while the polarization of free layer 305 is in the opposite direction. When the Y direction magnetic field ($H_y$) is applied, the polarization of free layers 305 and 309 rotate so that their net magnetic field (as designated by arrow 413) in polarization diagram 405 aligns with the polarization of the external field $H_y$ (as designated by arrow 415). When the X direction magnetic field ($H_x$) is applied at the same time as $H_y$ (as shown in polarization diagram 407), the polarization of free layers 305 and 309 again rotate so that their net field aligns with the net external field (see arrow 417). When magnetic field $H_y$ terminates, the polarization of free layers 305 and 309 again rotate so their net field aligns with the external field (as designated by arrow 419 in polarization diagram 409). Finally when field $H_x$ terminates, the polarization of free layers 305 and 309 again rotate to the nearest rest state, which is opposite of their initial rest state, i.e. free layer 309 is polarized opposite to that of the fixed layer 305 and free layer 305 is polarized in the same direction as the polarization of fixed layer 313, as shown in polarization diagram 411. In polarization diagram 411, MTJ 100 is in a high resistance state.

While a particular write cycle pulse sequence with overlapping magnetic field pulses with the Y pulse first, is shown in FIGS. 4 and 5, the MTJ 100 will respond to other pulse sequences. For example, sequential overlapping magnetic field pulses with the X pulse first will also toggle the bit by rotating the free layers in the opposite direction to change the bit state of the memory cell. However, isolated X or Y magnetic pulses will not change the bit state of the memory cell. On the other hand, some pulse sequences such as simultaneous or almost simultaneous X and Y magnetic pulses can leave the bit in an unknown state. Embodiments of a simulation model are designed to take these various possible state transitions into account during a simulation of an MRAM cell.

In some embodiments, when the two magnetic layers (e.g. fixed layer 313 and free layer 309) on either side of the tunnel junction dielectric (e.g. 311) are polarized in the same direction, the electron spins states in the materials of both those magnetic layers match, and the MTJ is in a low resistance state. However, when those two magnetic layers are polarized in opposite directions, the electron spin states do not match and the MTJ is in a high resistance state.

Figure 6:
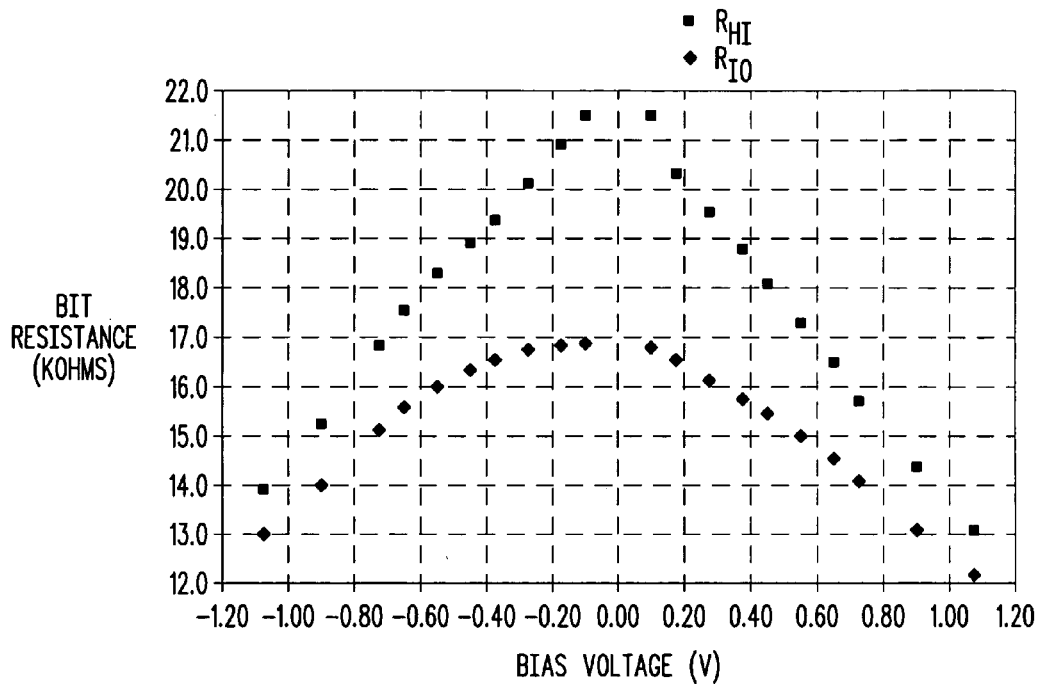
FIG. 6 shows plots of one embodiment of measured values of the resistance of an MTJ in both the low resistance state and the high resistance state as a function of bias voltage across the MTJ.

FIG. 6 shows plots of measured values of the resistance of an MTJ of one embodiment in both the low resistance state ($R_{lo}$), and the high resistance state ($R_{hi}$) as a function of bias voltage across the MTJ. Usually, the resistance characteristics of an MTJ are expressed in terms of its resistance in the low resistance state at zero bias voltage ($R_{loO}$), its resistance in the high resistance state at zero bias voltage ($R_{hiO}$), and the Magnetoresistive Ratio (MR). The MR is the ratio of the resistance in the high resistance at zero bias voltage to the resistance at the low resistance state at zero bias voltage expressed as a percentage above unity. For the embodiment of an MTJ whose measured results are shown in FIG. 6, $R_{loO}$ is approximately 17 KOhms, $R_{hiO}$ is approximately 22 KOhms, and the MR is approximately 29% as shown in Equation 5 below:

$$MR = \frac{R_{hiO}}{R_{loO}} - 1 = \frac{22 \text{ k}\Omega}{17 \text{ k}\Omega} - 1 = 29\% \qquad (5)$$

Since an MTJ includes two metal layers separated by a dielectric layer (e.g. tunnel junction dielectric 311), it also has a capacitive component. The capacitance of the MTJ can be approximated by:

$$C_{MTJ} = E_r E_o \frac{A_{MTJ}}{t_{ox}} \qquad (6)$$

where $\epsilon_r$ is the relative dielectric constant of the dielectric, ($Al_2O_3$ in one embodiment), $\epsilon_o$ is the permittivity of free space, $A_{MTJ}$ is the area of the MTJ, and $t_{ox}$ is the thickness of the tunnel junction dielectric in the MTJ.

Figure 7:
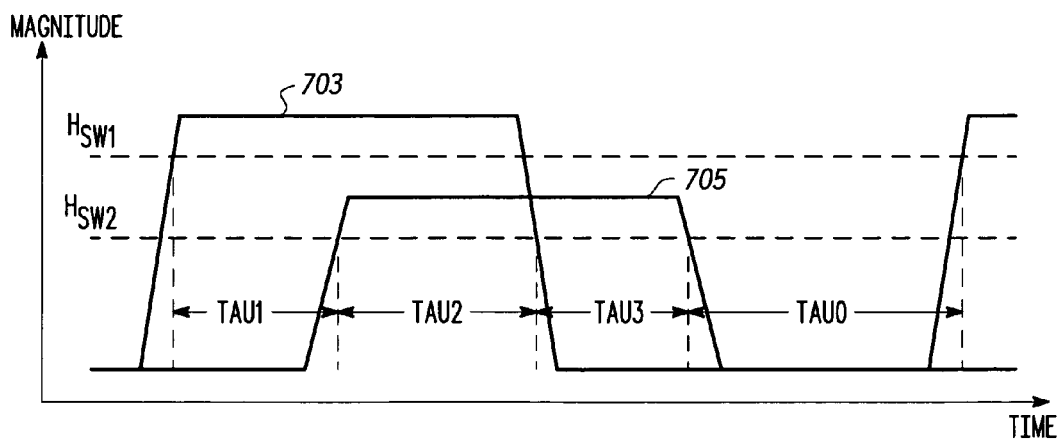
FIG. 7 shows one embodiment of a sequence of two magnetic pulses applied to an MTJ during a write cycle.

FIG. 7 shows a sequence of two magnetic pulses applied to an MTJ during a write cycle. These pulses are generated by applying current pulses through the write lines (e.g. lines 114, and 102). For one embodiment of a valid write cycle, the magnetic field of the first pulse 703 must reach a higher threshold ($H_{SW1}$) than a threshold ($H_{SW2}$) required from the magnetic field of the second pulse 705. The higher threshold is indicative of the higher rotational force required to rotate the polarization of the free layers from their rest position (e.g. as shown in polarization diagram 401) than when they are partially rotated (e.g. as shown in polarization diagrams 405, 407, and 409). In some embodiments, the higher magnetic field threshold is required for the first pulse, regardless of whether the first pulse is generated by current through line 102 or line 114.

In some embodiments, the polarizations of the free layers take time to stabilize while being rotated. Accordingly, minimum time requirements tau1, tau2, and tau3 are required in the model between pulse edges as shown in FIG. 7. Thus, in some embodiments, free layer polarization rotations with shorter times are not predictable and consequently cause errors in the model. Also in some embodiments, an additional minimum time (tau0) between write cycle pulse sequences is required to allow the polarizations of the free layers to stabilize in their rest state. In one embodiment, the minimum times are on the order of 1 to 2 ns.

In one example, first pulse 703 is generated by line 114 and second pulse 705 is generated by line 102 causing the polarizations of the free layers to be rotated one way. In another example, first pulse 703 is generated by line 102 and second pulse 705 is generated by line 114 causing the polarizations of the free layers to be rotated in an opposite way.

In some embodiments of a computer simulation model of an MRAM cell, a state machine can be implemented to model a write cycle of the MRAM cell. In some embodiments, the states of the state machine not only account for magnetic pulses during a write cycle of the MTJ, but also pulses acting on the MTJ generated during a write cycle of another MTJ located in the same row or column as the MTJ. In those instances, the MTJ being modeled may only be acted upon by a single magnetic pulse.

In one specific embodiment of a computer simulation model of an MRAM cell, a state machine includes four state variables. The first state variable is designated as "pulse 1." In the embodiment of FIG. 1, pulse 1 is set (to 1) when the magnetic field generated by the lower write line (e.g. line 114) passes the higher threshold (e.g. $H_{SW1}$) if it is the only magnetic pulse or the lower threshold (e.g. $H_{SW2}$) if the other pulse (the pulse generated by the upper write line, e.g. line 102) has already started. Pulse 1 is reset (to 0) when the pulse goes below the lower threshold ($H_{SW}2$).

The second state variable is designated as "pulse 2." Pulse 2 is set (to 1) when the magnetic field generated by the upper write line (e.g. line 102) passes the higher threshold (e.g. $H_{SW1}$) if it is the only magnetic pulse or the lower threshold (e.g. $H_{SW2}$) if the other pulse (the pulse generated by the lower write line, e.g. line 114) has already started. Pulse 2 is reset (to 0) when the pulse goes below the lower threshold ($H_{SW}2$).

The third state variable is designated as "1-2 pulse train." The 1-2 pulse train state variable is used to indicate when a pulse generated by the lower write line (e.g. line 114) is the first pulse (e.g. pulse 703 in FIG. 7) and a pulse generated by the upper write line (e.g. line 102) is the second pulse (e.g. pulse 705 in FIG. 7) in a write cycle pulse sequence. The 1-2 pulse train is set (to 1) when a write cycle pulse sequence starts with a pulse generated by the lower write line (e.g. line 114) (when its the first pulse in a write cycle pulse sequence) and a subsequent pulse generated by the upper write line (e.g. line 102) (the second pulse in the write cycle pulse sequence) passes the lower threshold (e.g. $H_{SW2}$). The 1-2 pulse train is reset (to zero) when the pulse generated by the upper write line (e.g. line 102) (the second pulse in the write cycle pulse sequence) goes below the lower threshold ($H_{SW}2$), indicating the end of a write cycle pulse sequence.

The fourth state variable is designated as "2-1 pulse train." The 2-1 pulse train state variable is used to indicate when a pulse generated by the upper write line (e.g. line 102) is the first pulse (e.g. pulse 703 in FIG. 7) and a pulse generated by the lower write line (e.g. line 114) is the second pulse (e.g. pulse 705 in FIG. 7) in a write cycle pulse sequence. The 2-1 pulse train is set (to 1) when a write cycle pulse sequence starts with a pulse generated by the upper write line (e.g. line 102) (when its the first pulse in a write cycle pulse sequence) and a subsequent pulse generated by the lower write line (e.g. line 114) (the second pulse in the write cycle pulse sequence) passes the lower threshold (e.g. $H_{SW2}$). The 2-1 pulse train is reset (to zero) when the pulse generated by the lower write line (e.g. line 114) (the second pulse in the write cycle pulse sequence) goes below the lower threshold ($H_{SW}2$), indicating the end of a write cycle pulse sequence.

For the specific embodiment described herein, the states of the state variables are changed in response to the magnetic pulses generated by the lower write line (e.g. line 114), and the upper write line (e.g. line 102).

When a magnetic pulse generated by the lower write line (e.g. line 114) is detected as passing the lower threshold ($H_{SW2}$) while increasing in magnitude, the results of the action are dependent on the states of the pulse 1, pulse 2, 1-2 pulse train, and 2-1 pulse train state variables. The Karnaugh Map in Table 1 indicates the results of the detection of this action.

TABLE 1

Pulse generated By the Lower Write Line (e.g. Line 114) Passing Lower Threshold ($H_{sw2}$) In Increasing Direction Where I indicates no action, E indicates an error, and S indicates a state change.

| | 1–2 pulse train/2–1 pulse train | | | |
|---|---|---|---|---|
| pulse1/pulse2 | 0 0 | 0 1 | 1 1 | 1 0 |
| 0 0 | I | E | E | E |
| 0 1 | S<br>check tau1 timer<br>pulse 1 set<br>2–1 pulse train set<br>tau2 timer reset | E | E | S<br>pulse 1 set |
| 1 1 | E | E | E | E |
| 1 0 | E | E | E | E |

Most of the cells in the Karnaugh map of Table 1 contain "E" (for error) for states that should not be logically reachable. For example, any state where 1-2 pulse train and 2-1 pulse train are both logical 1s is not reachable. The "I" (for ignore) indicates that although the transition is valid, there is no state change. The "S" indicates a state transition with the changes in the state variables provided in Table 1.

When a magnetic pulse generated by the lower write line (e.g. line 114) passes the lower threshold ($H_{SW2}$) with none of the state variables set (state 0, 0, 0, 0), the pulse transition is ignored since this might be a "first pulse" of a write cycle pulse sequence. In such case, the first pulse must therefore pass the higher threshold ($H_{SW1}$) to be a valid first pulse of a write cycle pulse sequence.

When pulse 1 is not set, pulse 2 is set, and neither pulse train is active (state 0, 1, 0, 0), the transition of a pulse generated by the lower write line (e.g. line 114) through the lower threshold ($H_{SW2}$) indicates the start of a 2-1 pulse train so both pulse 1 and 2-1 pulse train variables are set after checking that the tau1 time requirement in the first phase of the pulse train is met. Also, the tau2 timer is started. In one embodiment, the tau1 time requirement is determined to be met if the occurrence of a pulse generated by the lower write line (e.g. line 114) passing through the lower threshold ($H_{SW2}$) occurs at least tau1 time after the pulse generated by the upper write line (e.g. line 102) passes through the higher threshold ($H_{SW1}$). See FIG. 7 for an illustration of the tau1, tau2, tau3, and tau0 times during a write cycle pulse sequence.

When pulse 1 is not set, pulse 2 is set, and 1-2 pulse train is set (state 0, 1, 1, 0), the transition of a pulse generated by the lower write line (e.g. line 114) through the lower threshold ($H_{SW2}$) indicates that there was "ringing" in the lower write line (e.g. line 114) current near the lower threshold ($H_{SW2}$) as the pulse generated by the lower write line (e.g. line 114) is turning off. Thus, the pulse 1 variable is set.

All other states of Table 1 are not logically reachable and therefore are errors.

Table 2 is the Karnaugh Map for a pulse generated by the lower write line (e.g. line 114) passing through the higher threshold ($H_{SW1}$) while increasing in magnitude. When all the state variable are not set (state 0,0,0,0) a pulse generated by the lower write line (e.g. line 114) passing through the higher threshold ($H_{SW1}$) indicates the start of a first pulse of a write cycle pulse sequence or single pulse, so pulse 1 is set after the tau0 timer is checked. The tau1 timer is started.

In Table 2, all other states where pulse 1 is not set are erroneous (indicated by E). If in Table 2, pulse 1 is set, then the states are either erroneous or can be ignored since they are due to a pulse "ringing" near the upper threshold and do not change the state. Table 2 is set forth below.

TABLE 2

Pulse Generated by the Lower Write Line (e.g. Line 114) Passing Upper Threshold ($H_{sw1}$) in Increasing Direction. Where I indicates no action, E indicates an error, and S indicates a state change.

| | 1–2 pulse train/2–1 pulse train | | | |
|---|---|---|---|---|
| pulse1/pulse2 | 0 0 | 0 1 | 1 1 | 1 0 |
| 0 0 | S<br>check tau0 timer<br>pulse 1 set<br>tau1 timer reset | E | E | E |
| 0 1 | E | E | E | E |
| 1 1 | E | I | E | I |
| 1 0 | I | I | E | E |

Table 3 is similar to Table 1 and Table 4 is similar to Table 3 except that Tables 3 and 4 apply to a pulse generated by the upper write line (e.g. line 102), the pulse 1 and pulse 2 variables are interchanged, and the 1-2 pulse train and 2-1 pulse train variable are interchanged.

TABLE 3

Pulse Generated By The Upper Write Line (e.g. Line 102) Passing Lower Threshold ($H_{sw2}$) In Increasing Direction. Where I indicates no action, E indicates an error, and S indicates a state change.

| | 1–2 pulse train/2–1 pulse train | | | |
|---|---|---|---|---|
| pulse1/pulse2 | 0 0 | 0 1 | 1 1 | 1 0 |
| 0 0 | I | E | E | E |
| 0 1 | E | E | E | E |
| 1 1 | E | E | E | E |
| 1 0 | S<br>check tau1 timer<br>pulse 2 set<br>1–2 pulse train set<br>tau2 timer reset | S<br>pulse 2 set | E | E |

TABLE 4

Pulse Generated By the Upper Write Line (e.g. Line 102)
Passing Upper Threshold ($H_{sw1}$) While Increasing.
Where I indicates no action, E indicates an error, and S indicates a state change.

| pulse1/pulse2 | 1–2 pulse train/2–1 pulse train | | | |
|---|---|---|---|---|
| | 0 0 | 0 1 | 1 1 | 1 0 |
| 0 0 | S<br>check tau0 timer<br>pulse 2 set<br>tau1 timer reset | E | E | E |
| 0 1 | I | E | E | I |
| 1 1 | E | I | E | I |
| 1 0 | E | E | E | E |

Table 5 is the Karnaugh Map for a magnetic pulse generated by the lower write line (e.g. line 114) passing the lower threshold ($H_{SW2}$) while decreasing in magnitude. If all the state variable are not set (state 0,0,0,0), the pulse transition is ignored. This would normally be indicative of a stand alone, lower magnitude pulse that did not have a high enough magnitude to set the pulse 1 variable.

If pulse 1 is set and the other state variable are not set (state 1,0,0,0), a magnetic pulse generated by the lower write line (e.g. line 114) passing the lower threshold ($H_{SW2}$) while decreasing in magnitude indicates the end of a stand alone pulse. In this state, pulse 1 is reset and the tau0 timer is reset.

If both pulse 1 and pulse 2 are set and 2-1 pulse train is set (state 1,1,0,1), a magnetic pulse generated by the lower write line (e.g. line 114) passing the lower threshold ($H_{SW2}$) while decreasing in magnitude is due to "ringing" at the start of the second pulse in a write cycle pulse sequence. To maintain the state variables, both pulse 1 and 2-1 pulse train are reset.

If both pulse 1 and pulse 2 are set and 1-2 pulse train is set (state 1,1,1,0), a magnetic pulse generated by the lower write line (e.g. line 114) passing the lower threshold ($H_{SW2}$) while decreasing in magnitude is due to the end of the first pulse in the write cycle pulse sequence. After the tau2 timer is checked, pulse 1 is reset and the tau3 time is reset.

If pulse 1 is set, pulse 2 is not set, and 2-1 pulse train is set (state 1,0,0,1), then a magnetic pulse generated by the lower write line (e.g. line 114) passing the lower threshold ($H_{SW2}$) while decreasing in magnitude is due the end of a 2-1 write cycle pulse sequence. After a check of the tau3 timer, pulse 1 and 2-1 pulse train are reset, the tau0 timer is reset, and the bit state is toggled. All other states of Table 5 are not logically reachable and therefore are errors.

TABLE 5

Pulse generated by the Lower Write Line (e.g. line 114)
Passing Lower Threshold ($H_{sw2}$) in Decreasing Direction.
Where I indicates no action, E indicates an error, and S indicates a state change.

| pulse1/pulse2 | 1–2 pulse train/2–1 pulse train | | | |
|---|---|---|---|---|
| | 0 0 | 0 1 | 1 1 | 1 0 |
| 0 0 | I | E | E | E |
| 0 1 | E | E | E | E |
| 1 1 | E | S<br>pulse 1 reset<br>2–1 pulse train reset | E | S<br>check tau2 timer<br>pulse 1 reset<br>tau3 timer reset |
| 1 0 | S<br>pulse 1 reset<br>tau0 timer reset | S<br>check tau3 timer<br>pulse 1 reset<br>2–1 pulse train reset<br>tau0 timer reset<br>toggle bit state | E | E |

Table 6 is similar to Table 5 except that Table 6 applies to a pulse generated by the upper write line (e.g. line 102) and the pulse 1 and pulse 2 variables are interchanged and the 1-2 pulse train and 2-1 pulse train variables are interchanged.

TABLE 6

Pulse Generated by the Upper Write Line (e.g. Line 102)
Passing Lower Threshold (HSW2) in Decreasing Direction.
Where I indicates no action, E indicates an error, and S indicates a state change.

| pulse1/pulse2 | 1–2 pulse train/2–1 pulse train | | | |
|---|---|---|---|---|
| | 0 0 | 0 1 | 1 1 | 1 0 |
| 0 0 | I | E | E | E |
| 0 1 | S<br>pulse 2 reset<br>tau0 timer reset | E | E | S<br>check tau3 timer<br>pulse 2 reset<br>1–2 pulse train reset<br>tau0 timer reset<br>toggle bit state |
| 1 1 | E | S<br>check tau2 timer<br>pulse 2 reset<br>tau3 timer reset | E | S<br>pulse 2 reset<br>1–2 pulse train reset |
| 1 0 | E | E | E | E |

In one embodiment, a model for simulating an MRAM cell includes a model for MTJ (e.g. 100) conductance characteristics that is dependent upon a voltage across the MTJ (bias voltage) and MTJ operating temperature. In one embodiment, parameter values for the model are calculated using an empirical model from measured data.

Figure 12:
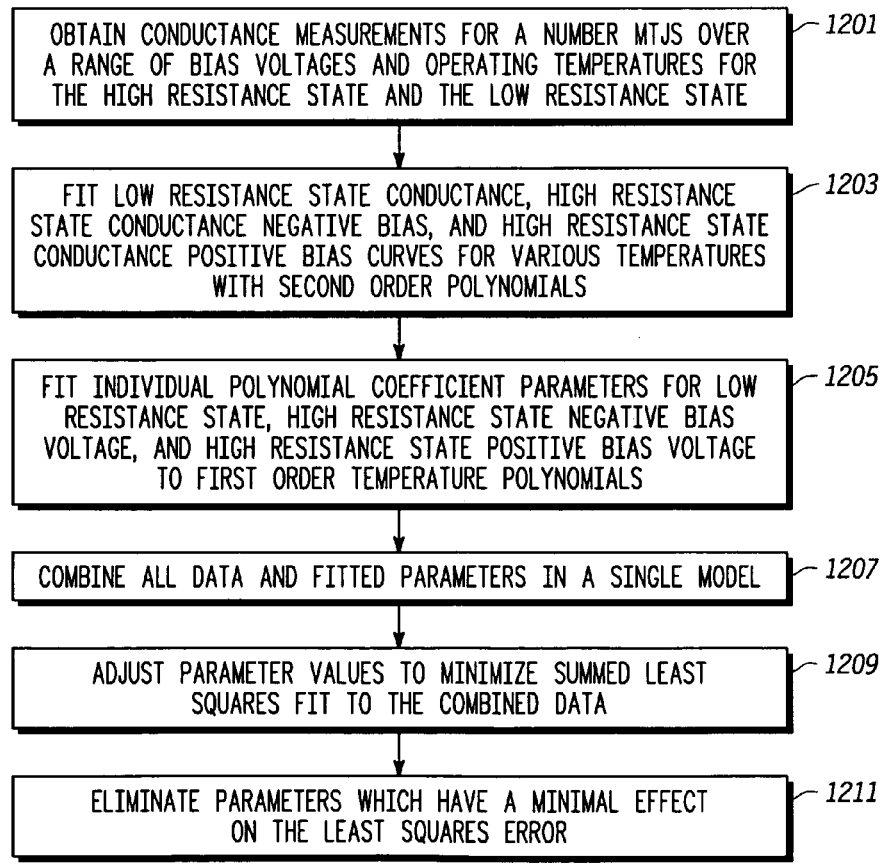
FIG. 12 sets forth a flow chart of one embodiment of a process for determining coefficients of equations that provide for a conductance value of an MTJ as a function of bias voltage and operating temperature for both a low resistance state and a high resistance according to the present invention.

FIG. 12 sets forth a flow chart for a process for determining coefficients of equations that provide for a conductance value of an MTJ as a function of bias voltage and operating temperature for both a low resistance state and a high resistance. These equations and coefficients may be used in a computer simulation model of an MRAM cell including e.g. a model implementing a state machine (e.g. the state machine described above with respect to Tables 1-6).

In 1201, physical measurements of conductance values are obtained from a number MTJ (e.g. 16) over a range of bias voltage increments and operating temperature increments for both the high resistive state and the low resistive state. In one example, measurements are made for both positive bias voltages and negative bias voltages.

Figure 8:
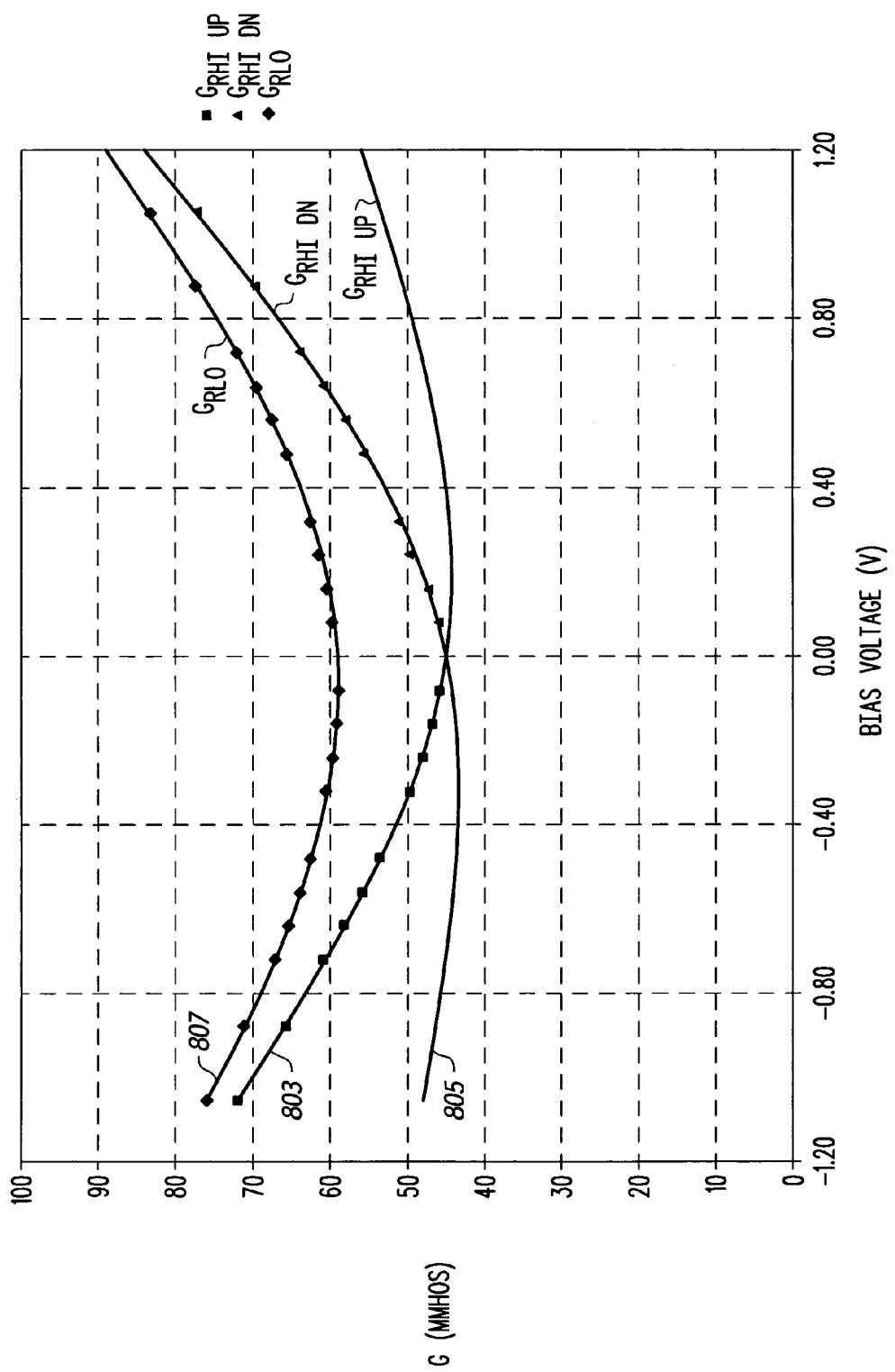
FIG. 8 shows an example of average conductance values of physical measurements from 16 MTJs as a function of bias voltage for both a high resistive state and a low resistance state.

FIG. 8 shows an example of average conductance values (in mmhos) of physical measurements from 16 MTJs as a function of bias voltage for both a high resistive state ($G_{Rhiup}$ and $G_{Rhidn}$) and a low resistance state ($G_{Rlo}$) at a temperature of 30 C. Regarding the high resistance state conductance, the subscript "up" is used for a negative bias voltage indicating that the current in the MTJ is "up" through the device and the subscript "dn" is used for the positive bias voltage indicating that the current in the MTJ is "down" through the device. Also shown in FIG. 8 are curve fits (803, 805, and 807) for the averaged measured data. For the embodiment, shown, the conductance measurements were made at bias voltage increments of approximately 0.10 Volts.

As shown in FIG. 8, a single second order polynomial (as shown by line 807) provides a very good fit to the data ($G_{Rlo}$) of the low resistance state while two second order polynomials, one for positive bias (line 805) and one for negative bias (line 803), are utilized for the high resistance state to have a similar level of fit. In one embodiment, the curve for the low resistance state is given below in equation 7:

$$G = 17.99V^2 + 3.28V + 59.25 \quad (7)$$

where V is the bias voltage in volts and G is the conductance of the MTJ in mmhos. The curve for the high resistance state positive bias voltage and the curve for the high resistance state negative bias voltage are given below in equations 8 and 9, respectively:

$$G = 14.68V^2 + 13.84V + 45.83 \quad (8)$$

$$G = 14.69V^2 - 8.29V + 45.66 \quad (9)$$

In 1203, the conductance measurements for the low resistive state, the high resistive state positive bias voltages, and the high resistive state negative bias voltages for various operating temperatures are fit into second order polynomial curves. In some embodiments, the fittings are performed using the least squares error measure or weighted least squares error measure.

Figure 9:
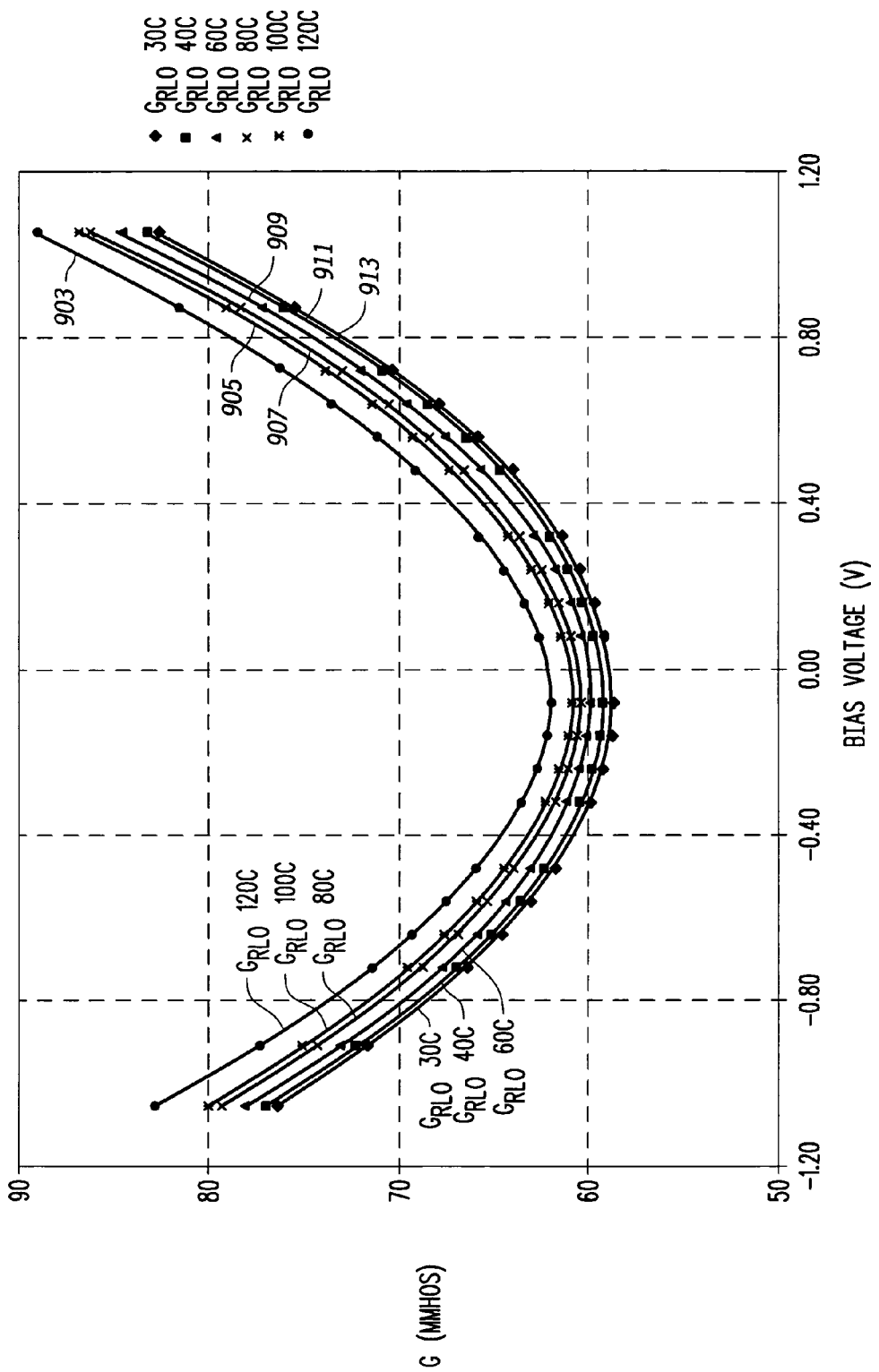
FIG. 9 shows an example of average conductance values of physical measurements from 16 MTJs as a function of bias voltage and temperature for the low resistance state.

FIG. 9 shows the average conductance values (in millimhos) of physical measurements from the same 16 MTJs as a function of bias voltage and temperature for the low resistance state (high conductance state). Each curve (913, 911, 909, 907, 905, and 903) represents a fit of a second order polynomials for each operating temperature at which measurements were made. In the embodiment shown, the measurements were made for operating temperatures of 30 degrees, 40 degrees, 60 degrees, 80 degrees, 100 degrees, and 120 degrees Celsius. The curve fits for the measurements at each temperature are given below:

$$30° C: G = 18.0V^2 + 3.3V + 59.3 \quad (10)$$

$$40° C: G = 18.3V^2 + 3.4V + 59.3 \quad (11)$$

$$60° C: G = 18.8V^2 + 3.4V + 60.2 \quad (12)$$

$$80° C: G = 19.4V^2 + 3.6V + 60.9 \quad (13)$$

$$100° C: G = 19.6V^2 + 3.6V + 61.2 \quad (14)$$

$$120° C: G = 21.2V^2 + 3.7V + 62.4 \quad (15)$$

Figure 10:
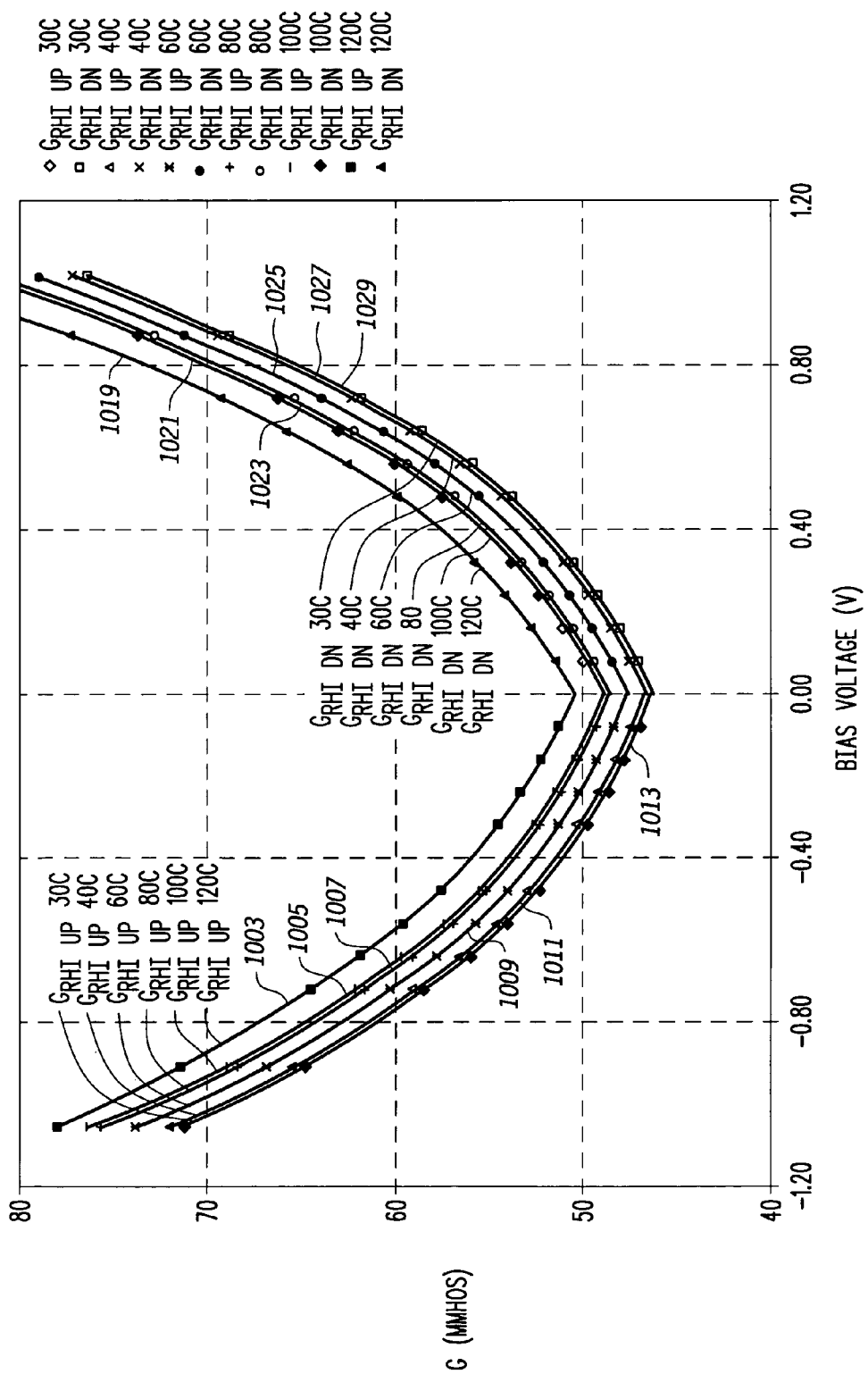
FIG. 10 shows an example average conductance values of physical measurements from 16 MTJs as a function of bias voltage and temperature for the high resistance state.

FIG. 10 shows the average conductance values (in millimhos) of physical measurements from the same 16 MTJs as a function of bias voltage and temperature for the high resistance state (low conductance state). Second order polynomials curves are fitted to the average measurements at each operating temperature for a positive bias voltage (curves 1029, 1027, 1025, 1023, 1021, and 1019) and for a negative bias voltage (curves 1013, 1011, 1009, 1007, 1005, and 1003). The curve fits for the measurements at each temperature for the positive bias voltage are given by the equations below:

$$30° C: G = 12.6V^2 + 15.9V + 45.5 \quad (16)$$

$$40° C: G = 13.0V^2 + 15.6V + 46.0 \quad (17)$$

$$60° C: G = 13.7V^2 + 15.3V + 46.9 \quad (18)$$

$$80° C: G = 14.7V^2 + 14.8V + 47.9 \quad (19)$$

$$100° C: G = 15.0V^2 + 14.8V + 48.4 \quad (20)$$

$$120° C: G = 16.9V^2 + 13.8V + 50.5 \quad (21)$$

The curve fits for the measurements at each temperature for the positive bias voltage are given by the equations below:

$$30° C: G = 14.7V^2 - 8.3V + 45.7 \quad (22)$$

$$40° C: G = 14.9V^2 - 8.3V + 46.0 \quad (23)$$

$$60° C: G = 15.3V^2 - 8.2V + 46.8 \quad (24)$$

$$80° C: G = 16.2V^2 - 7.6V + 47.8 \quad (25)$$

$$100° C: G = 16.4V^2 - 7.7V + 48.2 \quad (26)$$

$$120° C: G = 18.1V^2 - 6.7V + 50.3 \quad (27)$$

Referring back to FIG. 12, in 1205, the individual polynomial coefficients for the low resistance state conductance curves, the individual polynomial coefficients from the high resistance state positive bias voltage conductance curves, and the individual polynomial coefficients from the high resistance state negative bias voltage conductance curves are each fit to a first order temperature polynomial curve. The conductance curves for each temperature are of the form:

$$G = A + BV + CV^2 \quad (28)$$

In 1205, the polynomial coefficient parameters (A, B, and C) for the low resistance state, the high resistance state positive bias voltage, and the high resistance state negative bias voltage are each made into a function of temperature to reduce the number of parameters of a model.

Figure 11:
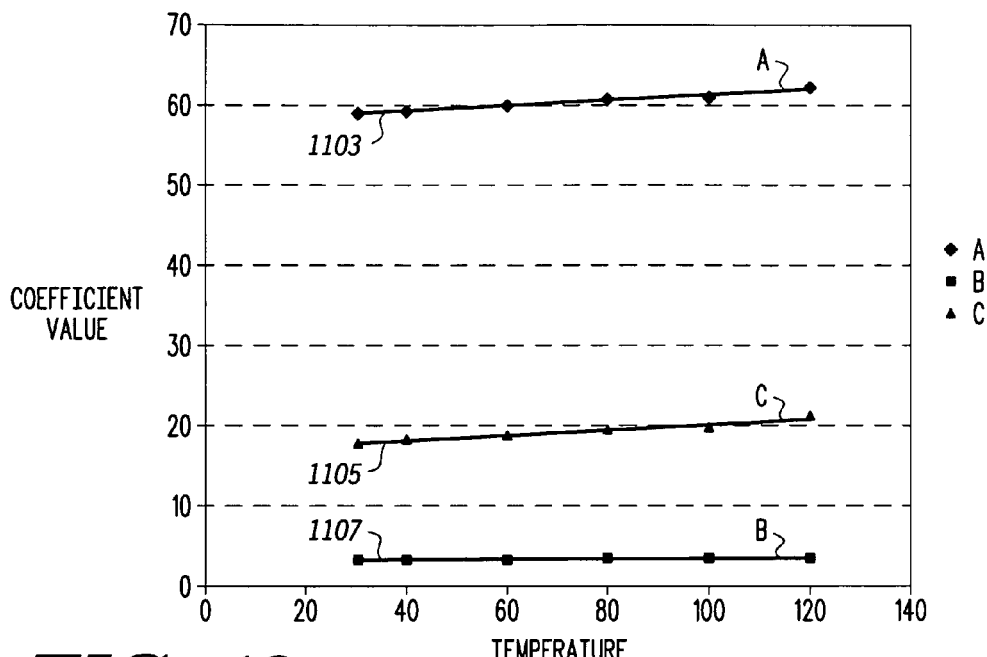
FIG. 11 is an example of a plot of a polynomial coefficient parameters for the curves shown in FIG. 9 as a function of temperature.

FIG. 11 is a plot of polynomial coefficient parameters (A, B, C) for the curves shown in FIG. 9 (equations 16-21) as a function of temperature. As shown in FIG. 11 for the case of the low resistance state, a liner temperature function provides a reasonable fit for the polynomial coefficient parameters. The curves for A (1103), B (1107), and C (1105) for the data plotted in FIG. 9 are given below:

$$A = .032T + 58.3 \quad (29)$$

$$B = 0.004T + 3.2 \quad (30)$$

$$C = 0.032T + 16.9 \quad (31)$$

where T is temperature.

Consequently, substituting equations 29, 30, and 31 into equation 28, the conductance curves shown in FIG. 9 an be modeled as:

$$G = (0.32T + 58.3) + (0.004T + 3.2)V + (0.032T + 16.9)V^2 \quad (32)$$

A linear fit also applies to polynomial coefficient parameters of the curves of the conductance of the MTJ in the high resistance state for both for positive bias voltage (curves 1019, 1021, 1023, 1025, 1027, and 1029) and for the negative bias voltage (curves 1003, 1005, 1007, 1009, 1011, and 1013).

Thus, the three temperature dependent second order polynomials in voltage can each have the form of:

$$G = G_o[(1+C_T \Delta T) + (C_{V1} + C_{TV1} \Delta T)V + (C_{V2} + C_{TV2} \Delta T)V^2] \quad (33)$$

where $G_0$ is the zero bias conductance at the reference temperature, $C_T$ is a temperature coefficient parameter of the $0^{th}$ order voltage coefficient (A), $C_{V1}$ is the $0^{th}$ order temperature coefficient parameter for the $1^{st}$ order voltage coefficient (B), $\Delta T$ is the change in temperature from a reference temperature, $C_{TV1}$ is a $1^{st}$ order temperature coefficient parameter of the $1^{st}$ order voltage coefficient (B), $C_{V2}$ is the $0^{th}$ order temperature coefficient parameter for the $2^{nd}$ order voltage coefficient (C), $C_{TV2}$ is a $1^{st}$ order temperature coefficient of the $2^{nd}$ order voltage coefficient (C). Using the format in Equation 33, the conductance function for the low resistance state can then be written as:

$$G_{Rlo} = \quad (34)$$
$$G_{Rlo0}[(1 + C_{TGrlo}\Delta T) + (C_{V1Grlo} + G_{TV1Grlo}\Delta T)V + (C_{V2Grlo} + G_{TV2Grlo}\Delta T)V^2]$$

where $G_{Rlo0} = \dfrac{1}{R_{lo}}$ where $R_{lo0}$ is the resistance for the zero bias voltage, reference (e.g. room) temperature, low resistance state resistance. For equation 34, the subscript "GRlo" is added to the coefficient named above with respect to equation 33 to indicate that the coefficients are for the low resistive state.

The two parts (the negative bias voltage part and the positive bias voltage part) of the conductance in the high resistance state must be continuous at zero bias voltage, restricting the two polynomials to the same value of $G_0$. The two high resistance state conductance functions can be written as follows:

$$G_{Rhiup} = G_{Rhi0}[(1 + C_{TGrhi}\Delta T) + \quad (35)$$
$$(C_{V1Grhiup} + C_{TV1Grhiup}\Delta T)V + C_{V2Grhiup} + C_{TV2Grhiup}\Delta T)V^2]$$

$$G_{Rhidn} = G_{Rhi0}[(1 + C_{TGrhi}\Delta T) + (C_{V1Grhidn} + C_{TV1Grhidn}\Delta T)V + \quad (36)$$
$$C_{V2Grhidn} + C_{TV2Grhidn}\Delta T)V^2]$$

where $G_{Rhi0} = \dfrac{1}{R_{hi0}} = \dfrac{1}{R_{lo0}(1+MR)}$.

For equation 35, the subscript "Grhiup" is added to the coefficients named above with respect to equation 33 to indicate that the coefficients are for the high resistive state negative bias voltage. For equation 36, the subscript "Grhidn" is added to the coefficients named above with respect to equation 33 to indicate that the coefficients are for the high resistive state positive bias voltage.

The values for the coefficients for equations 34, 35, and 36 for the data plotted in FIGS. 8, 9, and 10 are set forth in the column entitled "Values from Individual Curves" in Table 7 below. Also listed in the column are values for $R_{lo0}$ and MR. The values in this column are utilized as coefficient parameter values in a model of an MRAM. The parameter values given in this column are fitted curve by curve.

The last entry of this column, 105 ohms, is obtained, in one embodiment, by taking the root mean square error for the fit of the set of curves to the measured data.

TABLE 7

Model Parameters

| Parameter | Values from Individual Curves | Globally Optimized Values | Reduced Parameters | Unit |
|---|---|---|---|---|
| $R_{lo0}$ | 16.9 | 16.9 | 16.9 | K Ohms |
| MR | 30.0 | 30.5 | 30.2 | % |
| $C_{TGrlo}$ | 5.33E-4 | 5.30E-4 | 5.20E-4 | 1/° C. |
| $C_{V1Grlo}$ | 5.62E-2 | 5.81E-2 | 6.21E-2 | 1/V |
| $C_{TV1Grlo}$ | 6.97E-5 | 1.04E-4 | 0 | 1/V° C. |
| $C_{V2Grlo}$ | 3.02E-1 | 3.00E-1 | 2.98E-1 | 1/V² |
| $C_{TV2Grlo}$ | 5.35E-4 | 6.26E-4 | 6.57E-4 | 1/V²° C. |
| $C_{TGrhi}$ | 1.12E-3 | 1.11E-3 | 9.73E-4 | 1/° C. |
| $C_{V1Grhiup}$ | -1.85E-1 | -1.91E-1 | -1.64E-1 | 1/V |
| $C_{TV1Grhiup}$ | 3.51E-4 | 6.79E-4 | 0 | 1/V° C. |

TABLE 7-continued

Model Parameters

| Parameter | Values from Individual Curves | Globally Optimized Values | Reduced Parameters | Unit |
|---|---|---|---|---|
| $C_{V2Grhiup}$ | 3.17E-1 | 3.15E-1 | 3.37E-1 | 1/V² |
| $C_{TV2Grhiup}$ | 7.61E-4 | 1.02E-3 | 3.93E-4 | 1/V²° C. |
| $C_{V1Grhidn}$ | 3.49E-1 | 3.58E-1 | 3.51E-1 | 1/V |
| $C_{TV1Grhidn}$ | -4.53E-4 | -1.65E-4 | 0 | 1/V° C. |
| $C_{V2Grhidn}$ | 2.74E-1 | 2.66E-1 | 2.69E-1 | 1/V² |
| $C_{TV2Grhidn}$ | 9.68E-4 | 7.09E-4 | 6.14E-4 | 1/V²° C. |
| Average Error | 105 | 95 | 96 | Ohms |

Referring back to FIG. 12, in 1207, all of the parameters are combined to generate a global error measure for all of the curves. In one embodiment, the error measure is generated by the root mean square error, i.e. the square root of the average of the squares of the difference between the global model values and the individually measured actual conductance values. In another embodiment, the values at the different temperatures are given different weights before averaging. In one embodiment, the values nearer room temperature are given a higher weight than those farther away from room temperature.

In 1209, the parameter values are adjusted to generate a least squares fit of the parameters to the combined data. The column entitled "Globally Optimized Values" of Table 7 sets forth the values of the parameters after then have been adjusted in 1209. This column shows that the root mean square error is reduced to 95 ohms In 1211, coefficient parameters which have a minimal affect on the global error are eliminated. In one embodiment, the parameters are eliminated if by setting them to zero and re-optimizing the other parameter values (e.g. performing operation 1209 again with the values shown in the column entitled "Reduced Parameters" in Table 7). In one embodiment, a parameter is eliminated (e.g. set to 0 in some embodiments) if the increase in global error is less than a particular threshold (e.g. % 1) due to that parameter being eliminated. In some embodiments, re-optimization may be performed with a number of parameters set to zero. In other embodiments, the least effective parameters are set to zero until the cumulative effect exceeds a particular threshold.

In some embodiments parameter candidates for re-optimization may be manually selected (e.g. by trial and error) from an evaluation of the data. In other embodiments, re-optimization is performed for with each parameter set to zero. In other embodiments, re-optimization is performed for each combination of parameters set to zero, wherein the case that eliminates the most parameters and yet provides an error below a threshold is selected.

The column entitled "reduced parameters" of Table 7 shows a case where three of the parameters have been set to zero ($C_{TV1Grlo}$, $C_{TV1Grhiup}$, and $C_{TV1Grhidn}$) with the other parameters re-optimized. For this case, the total global error only increased by 1 ohm to 96 ohms from 95 ohms for the globally optimized values prior to elimination.

Providing a system for elimination of the parameters may provide for an MRAM cell model of increased efficiency in that less parameters are needed for calculation during a simulation of an MRAM memory.

FIGS. 13-19 set forth one embodiment of a portion of a MTJ computer simulation model. The simulation model runs as a part of a simulation program for an MRAM memory which calls the model at each iteration (e.g. time step in some embodiments) of a simulation of an MRAM memory. In the embodiment shown, the flows set forth in FIG. 13-19 are run for each time step (e.g. 100 picoseconds) of the simulation.

In the embodiment shown, the model implements the state machine of the Karnough Maps of Tables 1-6. The Karnough Map of Table 1 is implemented in the operations of FIG. 13 from diamond 1309 on down, the Karnough Map of Table 2 is implemented in the operations of FIG. 14, the Karnough Map of Table 3 is implemented in the operations of FIG. 15, the Karnough Map of Table 4 is implemented in the operations of FIG. 16, the Karnough Map of Table 5 is implemented in the operations of FIG. 17, and the Karnough Map of Table 6 is implemented in the operations of FIG. 18.

Figure 13:
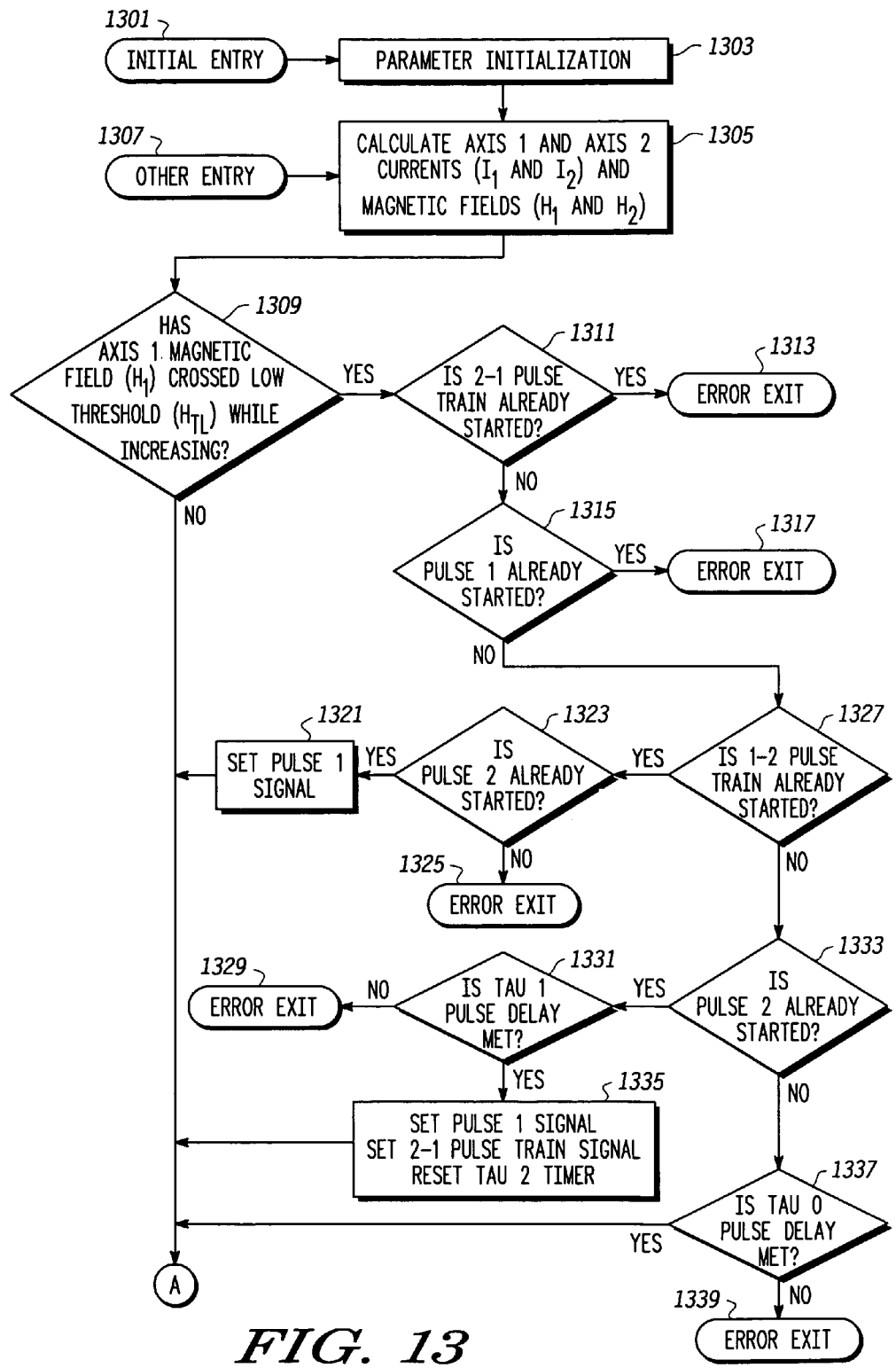
FIGS. 13-19 set forth one embodiment of a portion of a MTJ computer simulation model according to the present invention.

Referring to FIG. 13, there are two entry points for the model, initial entry 1301 and other entry 1307. Initial entry 1301 is used when the model is called for the first time in a simulation in a simulation of a memory. Other entry 1307 is used on subsequent calls to the model including during subsequent time steps of the simulation. After initial entry 1301, various model parameters are initialized in 1303 including parameters for conductance as a function of the specific operating temperature and the initial bit state of the MTJ being modeled. In one embodiment, the model parameters are initialized (e.g. as set forth in Table 7) by utilizing the globally optimized parameters or reduced parameters (if some parameters were able to be eliminated) (e.g. as set forth in Table 7) as derived by a process similar to that set forth in FIG. 12.

Once the initial conductance model parameters are set, the three conductance equations (low resistance state, high resistance state negative bias voltage, and high resistive state positive bias voltage) of an MTJ for simulation at a particular temperature looks like:

$$G=G_o[C_{V0}+C_{V1}V+C_{V2}V^2] \tag{37}$$

In one embodiment, the coefficient parameters $C_{V0}$, $C_{V1}$, and $C_{V2}$ for each of the three conductance equations are calculated in 1303 using equations 34, 35, and 36, respectively, with the values derived by the method of FIG. 12 as the coefficients for those equations and at the initial operating temperature. For example, $C_{V0}$ (in equation 37 above) for the low resistance state case is calculated as (from equation 34) as being equal to $1+C_{TGrlo}$ *(the difference between the reference temperature and the initialized temperature).

In 1305, the model calculates the Axis 1 and Axis 2 currents ($I_1$ and $I_2$) and the magnetic fields ($H_1$ and $H_2$) for those fields from those currents. In the embodiment shown, Axis 1 is the write conductor located beneath the MTJ (e.g. metal line 114 in the embodiment of FIG. 1) and Axis 2 is the write conductor located above the MTJ (e.g. metal line 102 in the embodiment of FIG. 1).

The model then sequentially checks whether the magnetic field $H_1$ generated by the current of Axis 1 (the Axis 1 magnetic field) has passed the lower threshold ($H_{TL}$) while increasing (decision diamond 1309 of FIG. 13) since the last iteration of the model, whether the Axis 1 magnetic field has passed the higher threshold ($H_{TH}$) while increasing (decision diamond 1403 of FIG. 14) since the last iteration of the model, whether the magnetic field $H_2$ generated by the current of Axis 2 (the Axis 2 magnetic field) has passed the lower threshold ($H_{TL}$) while increasing (decision diamond 1503 of FIG. 15) since the last iteration of the model, whether the Axis 2 magnetic field has passed the higher threshold ($H_{TH}$) while increasing (decision diamond 1603 of FIG. 16) since the last iteration of the model, whether the Axis 1 magnetic field has passed the lower threshold ($H_{TL}$) while decreasing (decision diamond 1703 of FIG. 17) since the last iteration of the model, and whether the Axis 2 magnetic field has passed the lower threshold ($H_{TL}$) while decreasing (decision diamond 1803 of FIG. 18) since the last iteration of the model.

If any of the checks is set forth in the preceding paragraph is positive, the model parses the state of the model according to the one Karnough Map in Tables 1-6 associated with the decision diamond that generated the positive check (e.g. the map of Table 1 is associated with diamond 1309, the map of Table 2 is associated with diamond 1403, the map of Table 3 is associated with diamond 1503, the map of Table 4 is associated with diamond 1603, the map of Table 5 is associated with diamond 1703, and the map of Table 6 is associated with diamond 1803).

Referring to FIG. 13, if in diamond 1309, the model determines that the Axis 1 magnetic field ($H_1$) has crossed the low threshold ($H_{TL}$) while increasing, the model then determines in diamond 1311 whether a 2-1 pulse train has already started. The model determines whether the 2-1 pulse train has already started by determining whether the 2-1 pulse train signal has been set (e.g. at a logical 1). If the 2-1 pulse train has been set, the model returns an error in operation 1313 in that such a condition is not logically reachable (e.g. it represents the state 0,0,1,0 of Table 1 which has an E). For the flows of FIGS. 13-19, the "error exit" operations (e.g. 1313, 1317) represent states that should not be logically reachable.

If no in diamond 1311 (e.g. the 2-1 pulse train signal is a logical zero), the model then determines in diamond 1315 whether pulse 1 has already started. The model determines whether pulse 1 has started by determining whether the pulse 1 signal has been set (e.g. is at a logical 1). If yes in diamond 1315, the model returns an error in operation 1317 indicating an unreachable state.

If no in diamond 1315, the model determines whether the 1-2 pulse train has already started in diamond 1327. The model determines whether the 1-2 pulse train has already started by determining whether the 1-2 pulse train signal has been set. If yes in diamond 1327, the model determines whether pulse 2 has already started in diamond 1323. The model determines whether pulse 2 has already started by determining whether the pulse 2 signal has been set. If yes in diamond 1323, then the model sets the pulse 1 signal (to 1) in 1321. If no in diamond 1323, the model returns an error in operation 1325.

If no in diamond 1327, the model determines whether pulse 2 has already started in diamond 1333. If yes in 1333, the model determines whether the tau 1 pulse delay has been met in diamond 1331. If yes in diamond 1331, then the model sets the pulse 1 signal (to 1), sets the 2-1 pulse train signal (to 1), and resets the tau 2 timer in operation 1335. If no in diamond 1333, then the model in diamond 1337 determines whether the tau 0 pulse delay has been met. If no in diamond 1337, then the model returns an error in operation 1339. If no in diamond 1331, the model returns an error in operation 1329.

Figure 14:
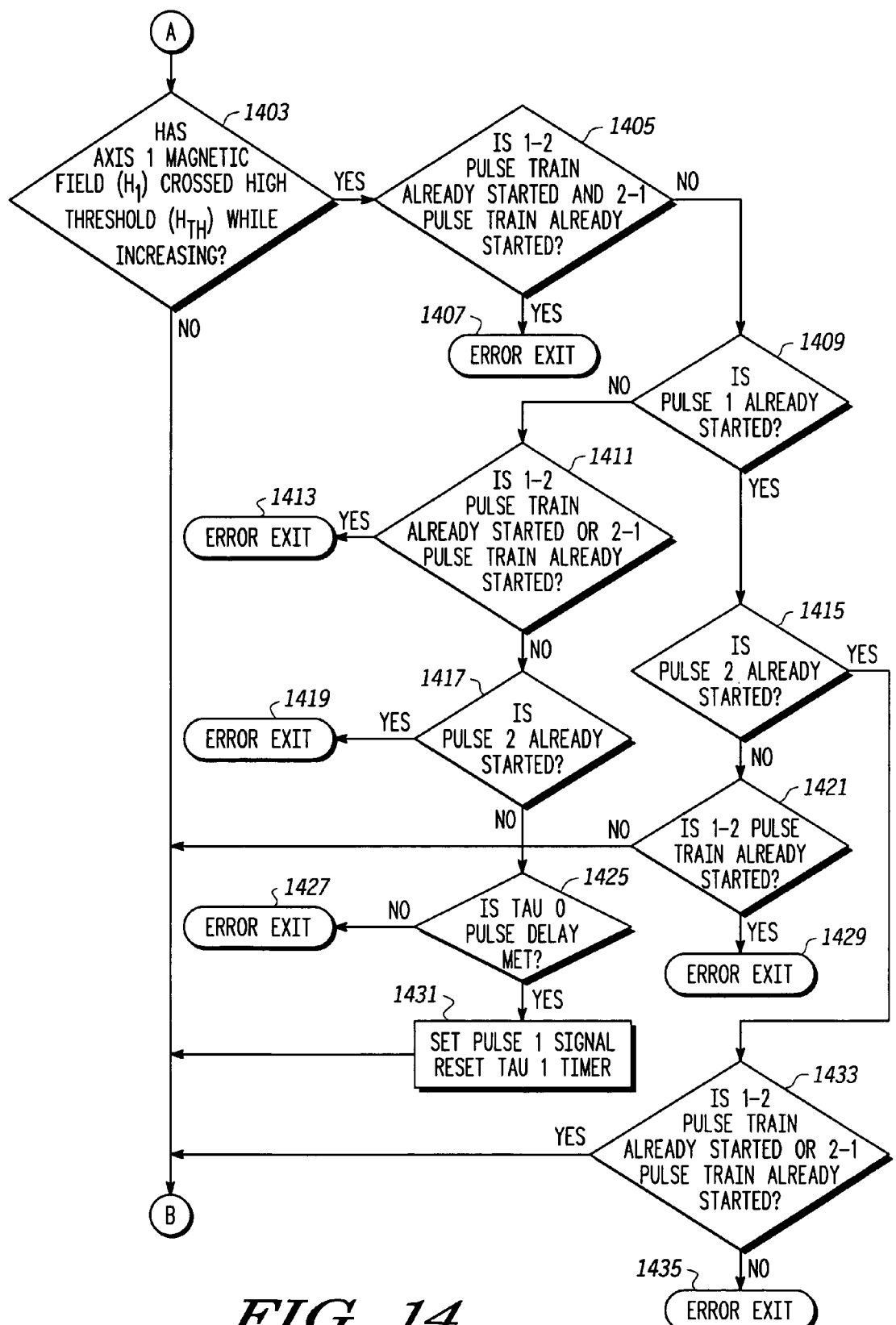

If no in diamond 1309, after operation 1321, after operation 1335, or if yes in diamond 1337, the model then goes to diamond 1403 of FIG. 14 to determine whether the axis 1 magnetic field ($H_1$) has crossed the high threshold ($H_{TH}$) while the magnitude has been increasing.

If yes in diamond 1403, then the model determines in diamond 1405 whether the 1-2 pulse train has already started and the 2-1 pulse train has already started. If yes in diamond 1405, then the model returns an error in operation 1407. If no in 1405, then the model determines in diamond 1409 whether pulse 1 has already started. If no in 1409, then in diamond 1411, the model determines whether the 1-2 pulse train has already started or the 2-1 pulse train has already started in diamond 1411. If yes in diamond 1411, then the model returns an error in 1413. If no in 1411, then the model determines in diamond 1417 whether pulse 2 has already started. If yes in 1417, then the model returns an error in 1419. If no in 1417, then the model determines whether the tau 0 pulse delay has been met in diamond 1425. If no in diamond 1425, the model returns an error in operation 1427. If yes in diamond 1425, the model sets the pulse 1 signal (to 1) and resets the tau 1 timer in operation 1431.

If yes in diamond 1409, then the model in diamond 1415 determines whether pulse 2 has already started. If yes in diamond 1415, then the model determines in 1433 whether the 1-2 pulse train has already started or the 2-1 pulse train has already started. If no in diamond 1433, then the model returns an error in operation 1435. If no in diamond 1415, then the model in diamond 1421 determines whether the 1-2 pulse train has already started. If yes in diamond 1421, then the model returns an error in operation 1429. If no in diamond 1403, if no in diamond 1421, if no in diamond 1433, or after operation 1431, the model then goes to diamond 1503 of FIG. 15.

Figure 15:
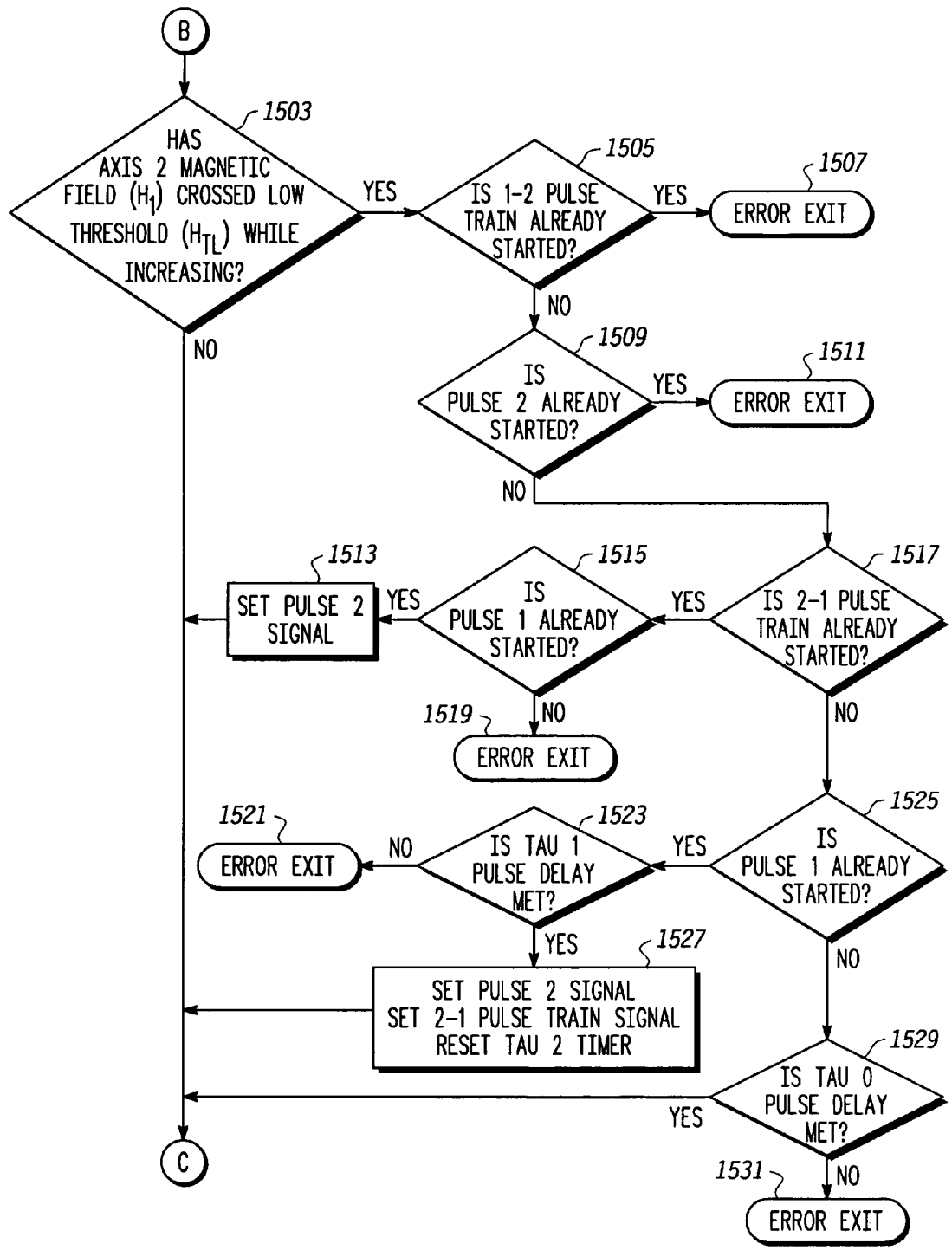

Referring to FIG. 15, in diamond 1503, the model determines whether the axis 2 magnetic field ($H_2$) has crossed the low threshold ($H_{TL}$) while increasing. If yes in 1503, the model determines in diamond 1505 whether the 1-2 pulse train has already started. If yes in diamond 1505, the model returns an error in 1507. If no in diamond 1505, the model determines in diamond 1509 whether pulse 2 has already started. If yes in diamond 1509, then the model returns an error in operation 1511. If no in diamond 1509, the model determines in diamond 1517 whether the 2-1 pulse train has already started. If yes in diamond 1517, the model determines in diamond 1515 whether pulse 1 has already started. If no in diamond 1515, the model returns an exit in operation 1519. If yes in diamond 1515, the model sets the pulse 2 signal (to 1) in operation 1513.

If no in diamond 1517, the model in diamond 1525 determines whether pulse 1 has already started. If yes in diamond 1525, the model determines whether the tau 1 pulse delay has been met in diamond 1523. If no in diamond 1523, the model returns an error in operation 1521. If yes in diamond 1523, the model sets the pulse 2 signal (to 1), sets the 2-1 pulse train signal (to 1), and resets the tau 2 timer in operation 1527. If no in diamond 1525, the model in diamond 1529 determines whether the tau 0 pulse delay has been met. If no in diamond 1529, the model returns an error in operation 1531.

Figure 16:
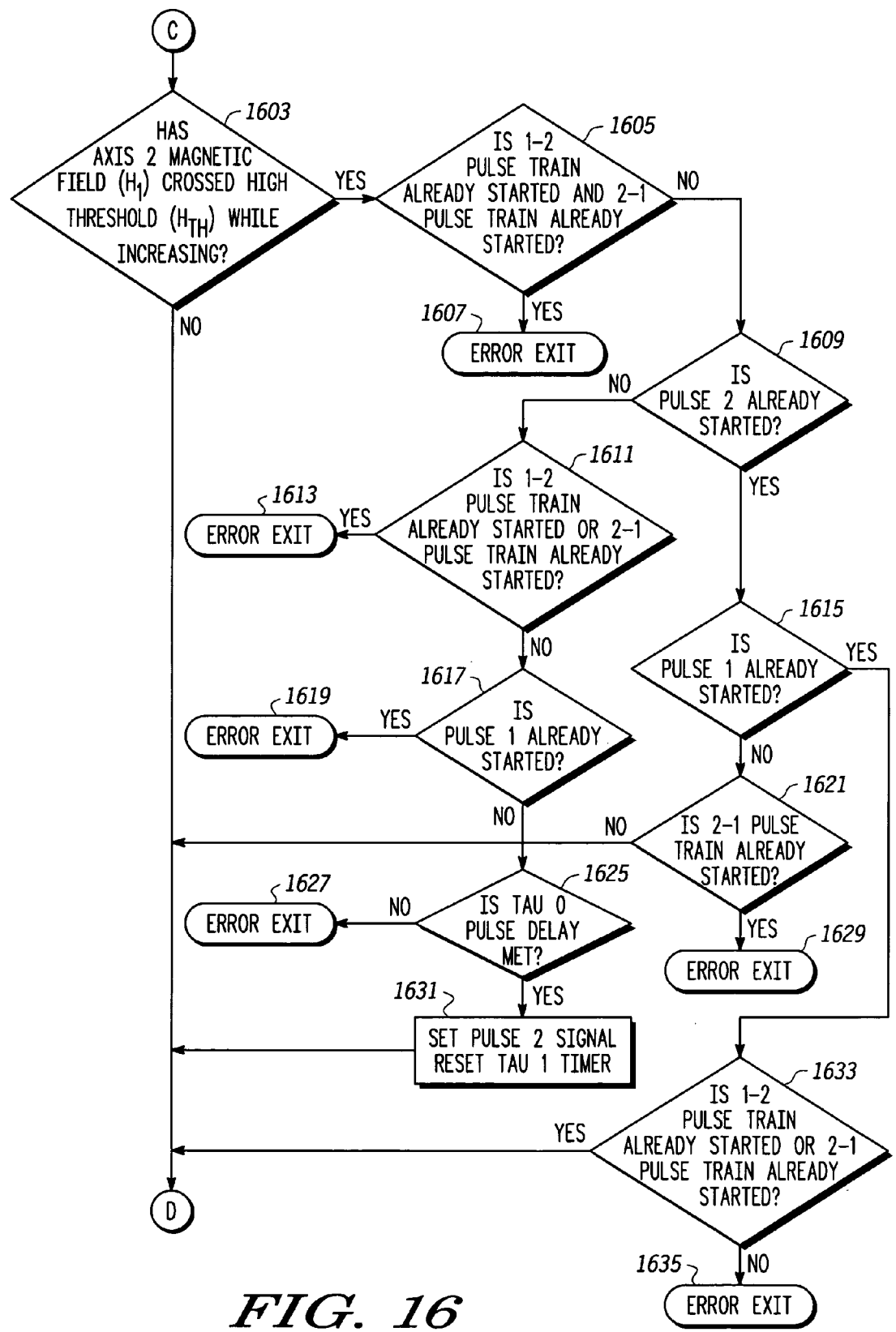

If no in diamond 1503, after the pulse 2 signal has been set in 1513, after operation 1527, or if yes in diamond 1529, the model then proceeds to diamond 1603 of FIG. 16.

Referring to FIG. 16, in diamond 1603 the model determines whether the axis 2 magnetic field ($H_2$) has crossed the high threshold ($H_{TH}$) while increasing. If yes in diamond 1603, then the model in diamond 1605 determines whether the 1-2 pulse train has already started and the 2-1 pulse train has already started. If yes in diamond 1605, then the model returns an error in diamond 1607. If no in diamond 1605, then model determines in diamond 1609 whether pulse 2 has already started. If no in diamond 1609, then the model determines whether the 1-2 pulse train has started or whether the 2-1 pulse train has started in diamond 1611. If yes in diamond 1611, then the model returns an error in operation 1613. If no in diamond 1611, the model in diamond 1617 determines whether pulse 1 has started. If yes in diamond 1617, then the model returns an error in operation 1619. If no in diamond 1617, then the model in diamond 1625 determines whether the tau 0 pulse delay has been met. If no in diamond 1625, the model returns an error in operation 1627. If yes in diamond 1625, the model sets the pulse 2 signal (to 1) and resets the tau 1 timer in operation 1631.

If yes in diamond 1609, the model determines whether pulse 1 has started in diamond 1615. If no in diamond 1615, the model determines whether the 2-1 pulse train has started in diamond 1621. If yes in diamond 1621, the model returns an error in operation 1629. If yes in diamond 1615, the model in diamond 1633 determines whether the 1-2 pulse train has already started or the 2-1 pulse train has already started. If no in diamond 1633, then the model returns an error in operation 1635. If no in diamond 1603, if no in diamond 1621, after operation 1631, or if yes in diamond 1633, the model proceeds to diamond 1703 of FIG. 17.

Figure 17:
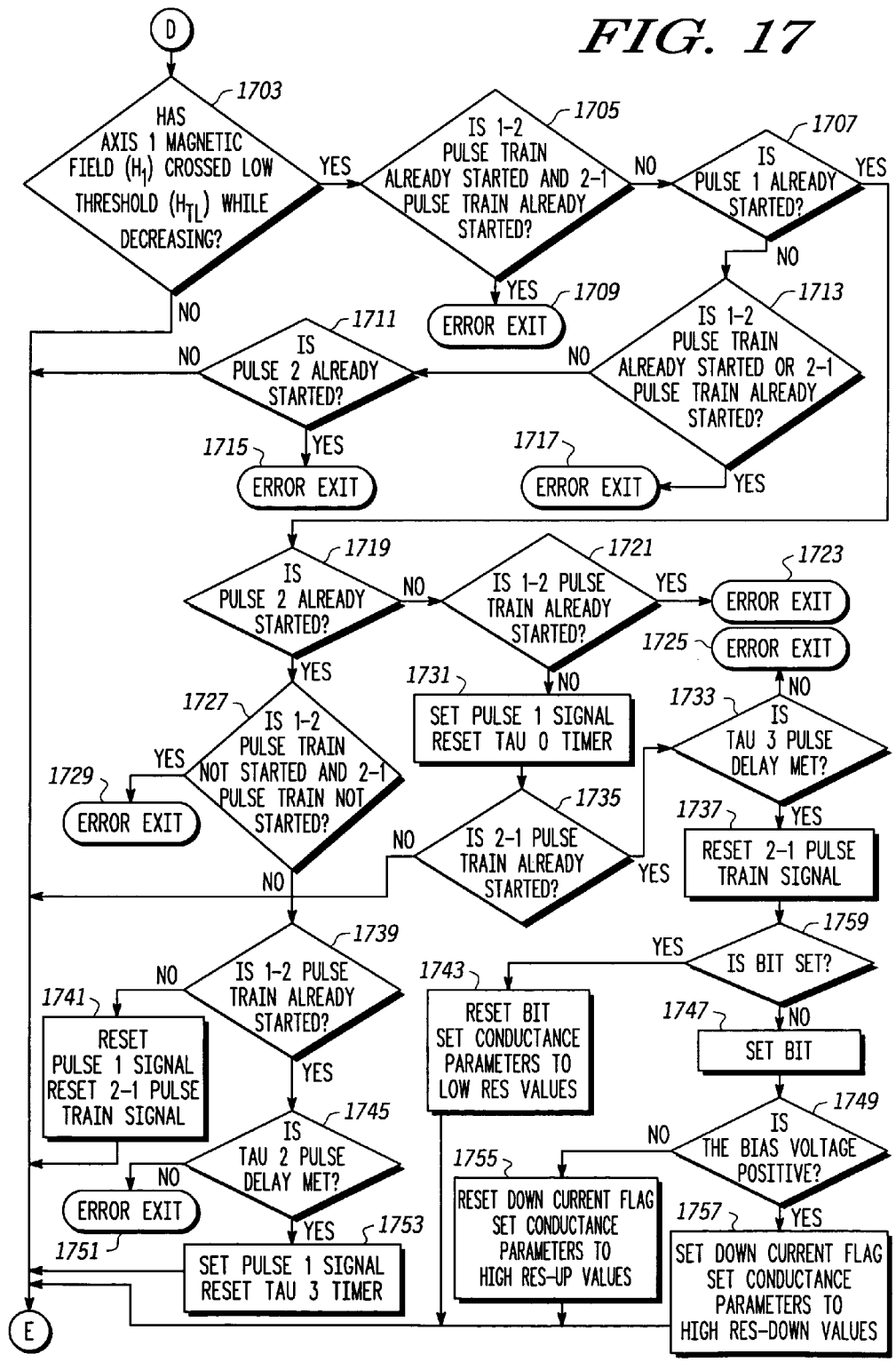

Referring to FIG. 17, in diamond 1703, the model determines whether the axis 1 magnetic field (HI) has crossed the low threshold ($H_{TL}$) while decreasing. If yes in diamond 1703, the model determines whether the 1-2 pulse train has already started and the 2-1 pulse train has already started in diamond 1705. If yes in diamond 1705, the model returns an error in operation 1709. If no in diamond 1705, the model in diamond 1707 determines whether pulse 1 has already started. If no in diamond 1707, the model in diamond 1713 determines whether the 1-2 pulse train has started or the 2-1 pulse train has started. If no in diamond 1713, then in diamond 1711 the model determines whether pulse 2 has started. If yes in diamond 1711, the model returns an error in operation 1715. If yes in diamond 1713, the model returns an error in operation 1717.

If yes in diamond 1707, the model determines in diamond 1719 whether pulse 2 has started. If no in diamond 1719, the model in diamond 1721 determines whether the 1-2 pulse train has started. If yes in diamond 1721, the model returns an error in operation 1723. If no in diamond 1721, the model sets the pulse 1 signal and resets the tau 0 timer in operation 1731. After operation 1731, the model in diamond 1735 determines whether the 2-1 pulse train has started. If yes in diamond 1735, the model in diamond 1733 determines whether the tau 3 pulse delay has been met. If no in diamond 1733, the model returns an error in operation 1725. If yes in diamond 1733, the model resets the 2-1 pulse train signal in operation 1737.

After operation 1737, the model in diamond 1759 determines whether the MTJ bit value has been set (whether the bit value is 1). If yes in diamond 1759, the model then resets the bit value (to 0) and sets the conductance parameters to the low resistive state values (e.g. using the coefficients for the low resistance state) in operation 1743. In one embodiment, the model sets the conductance parameters to low resistance state values to implement equation 34 for determining the conductance provided by the MTJ in the circuit.

If no in diamond 1759, the model sets the bit value of the MTJ cell (to 1) in operation 1747. After operation 1747, in diamond 1749, the model determines whether the bias voltage is positive. If in diamond 1749, the bias voltage is determined not to be positive (e.g. has a negative bias voltage) the model resets the down current flag and sets the conductance parameters to the high resistance state up values in operation 1755. In one embodiment, the model sets the conductance parameters to the high resistance state values such that it will use equation 35 in providing the conductance for the MTJ.

If yes in diamond 1749, the model sets the down current flag (to 1) to indicate that the bias voltage is positive in operation 1757. Also in operation 1757, in one embodiment, the model sets the conductance parameters to the high resistance state down values. Accordingly, in this embodiment, the model will use equation 36 when providing the conductance of the MTJ.

If yes in diamond 1719, the model determines in diamond 1727 whether the 1-2 pulse train has not started and the 2-1 pulse train has not started. If yes in diamond 1727, the model returns an error in operation 1729. If no in diamond 1727, the model in diamond 1739 determines if the 1-2 pulse train has already started. If no in diamond 1739, the model in 1741 resets the pulse 1 signal and resets the 2-1 pulse train signal. If yes in 1739, the model in 1745 determines whether the tau 2 pulsed delay time has been met. If no in diamond 1745, the model returns an error in operation 1751. If yes in diamond 1745, the model sets the pulse 1 signal and resets the tau 3 timer in operation 1753.

Figure 18:
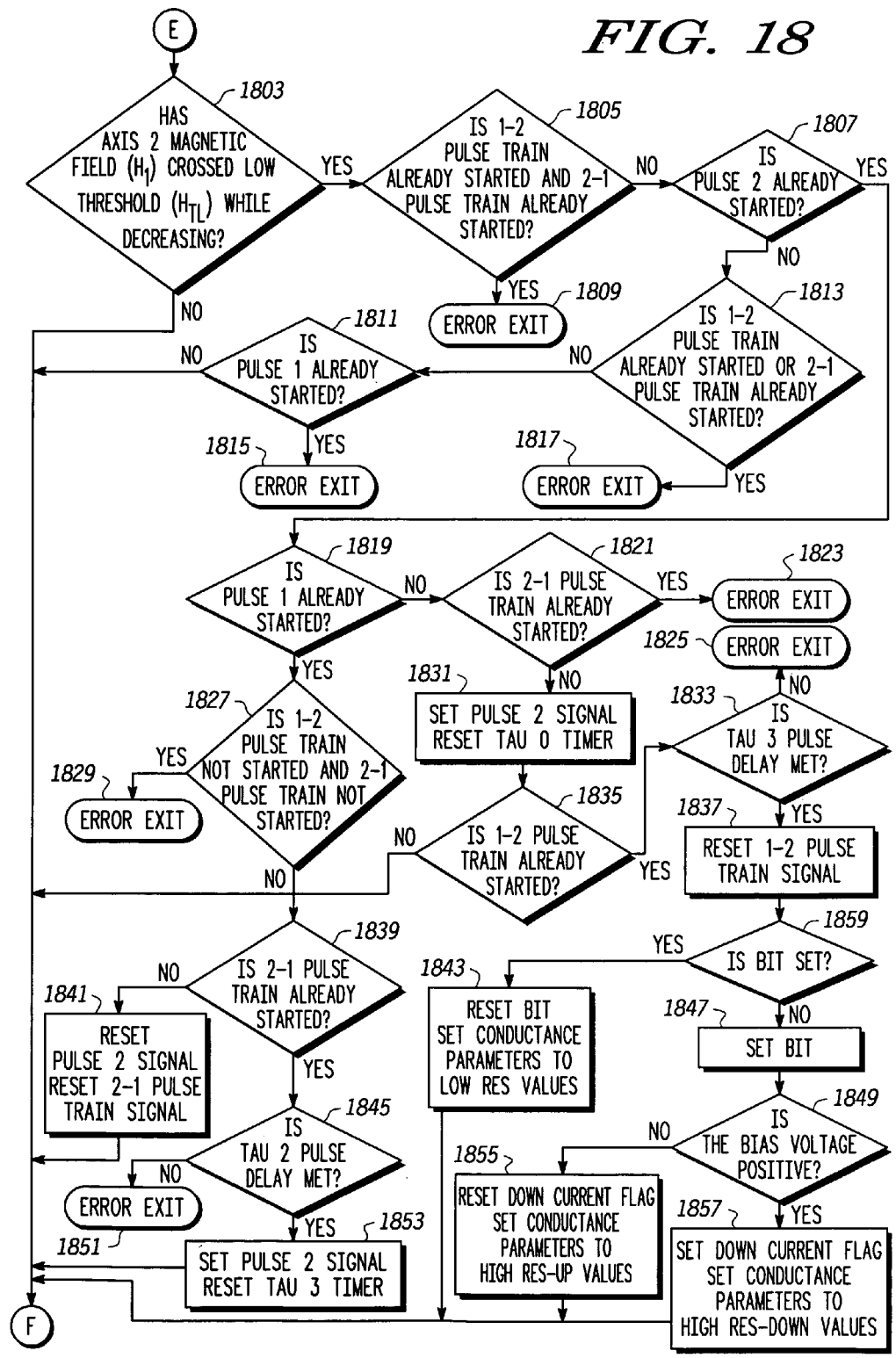

If no in diamond 1703, if no in diamond 1711, if no in diamond 1735, after operation 1741, after operation 1743, after operation 1753, after operation 1755, or after operation 1757, the model goes to diamond 1803 of FIG. 18.

Referring to FIG. 18, in diamond 1803, the model determines whether the axis 2 magnetic field ($H_2$) has crossed the low threshold ($H_{TL}$) while decreasing. If yes in diamond 1803, the model in diamond 1805 determines whether the 1-2 pulse train has already started and the 2-1 pulse train has already started. If yes in diamond 1805, the model returns an error in operation 1809. If no in diamond 1805, the model determines in diamond 1807 whether pulse 2 has started. If no in diamond 1807, the model determines in diamond 1813 if the 1-2 pulse train has started or the 2-1 pulse train has started. If yes in diamond 1813, the model returns an error in operation 1817. If no in diamond 1813, the model determines in diamond 1811 whether the pulse 1 has started. If yes in diamond 1811, the model returns an error in operation 1815.

If yes in diamond 1807, the model determines in diamond 1819 if pulse 1 has started. If no in diamond 1819, the model determines in diamond 1821 if the 2-1 pulse train has started. If yes in diamond 1819, the model returns an error in operation 1823. If no in diamond 1821, the model sets the pulse 2 signal (to 1) and resets the tau 0 timer in operation 1831. After operation 1831, the model in diamond 1835 determines whether the 1-2 pulse train has already started. If yes is 1835, then the model determines whether the tau 3 pulse delay has been met in diamond 1833. If no in diamond 1833, the model returns an error in operation 1825.

If yes in diamond 1833, the model resets the 1-2 pulse train signal in operation 1837. After operation 1837, the model in diamond 1859 determines whether the MTJ bit value is set (to 1). If yes in diamond 1859, the model resets the MTJ bit value (to 0) in operation 1843. Also in operation 1843, in one embodiment, the model sets the conductance parameters to the low resistive state values. Accordingly, in one embodiment, the model will use equation 34 for providing the conductance of the MTJ.

If in 1859, the MTJ bit value is not set, then the model will set the MTJ bit value (to 1) in operation 1847. After operation 1847, the model determines in 1849 whether the bias voltage is positive. If the biased voltage is not positive in diamond 1849, the model resets the down current flag in operation 1855. Also in operation 1855, in one embodiment, the model sets the conductance parameters to the high resistive state up values. Accordingly in determining the conductance of the MTJ, the model will use equation 35.

If the bias voltage is determined to be positive in diamond 1849, the model will set the down current flag (to 1) in operation 1857. Also in operation 1857, in one embodiment, the model will set the conductance parameters to the high resistive state down values. Accordingly, the model would provide the conductance of the MTJ as set forth in equation 36.

If yes in 1819, the model then determines in 1827 if the 1-2 pulse train has not started and the 2-1 pulse train has not started. If yes in diamond 1827, the model returns an error in operation 1829. If no in diamond 1827, the model determines in 1839 if the 2-1 pulse train has already started. If no in diamond 1839, the model then resets the pulse2 signal (to 0) and resets the 2-1 pulse train signal (to 0) in operation 1841. If yes in diamond 1839, the model determines in diamond 1845 whether the tau 2 pulse delay has been met. If no in diamond 1845, the model returns an error in operation 1851. If yes in diamond 1845, the model sets the pulse 2 timer signal (to 1) and resets the tau 3 timer in operation 1853.

Figure 19:
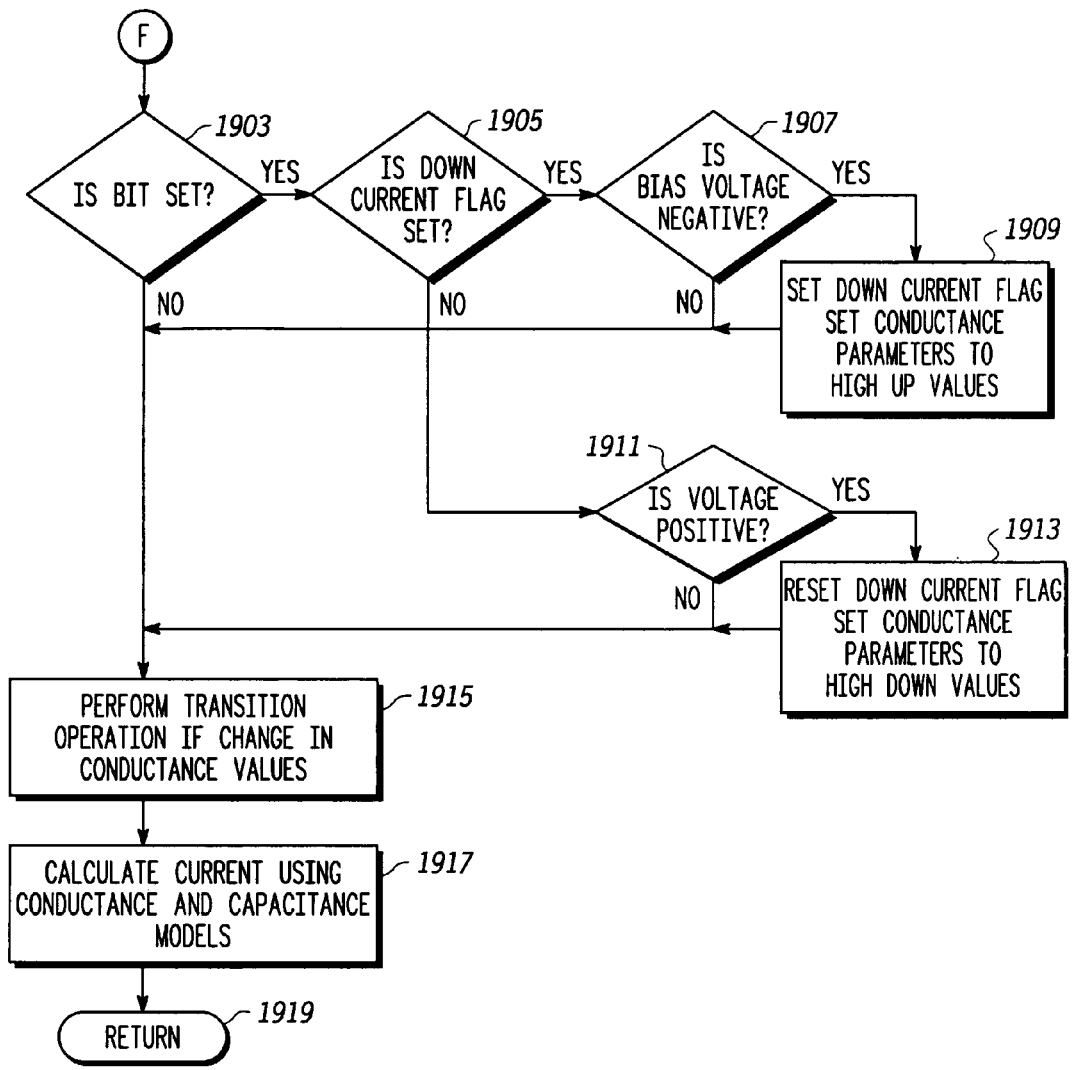

If no in diamond 1803, if no in diamond 1811, if no in diamond 1835, after operation 1841, after operation 1853, after operation 1843, after operation 1855, or after operation 1857, the model then proceeds to diamond 1903 of FIG. 19.

Referring to FIG. 19, once the switching threshold checks are completed (diamonds 1309, 1403, 1503, 1603, 1703, and 1803), the MTJ bit state is checked in diamond 1903. This check is redundant if the bit has just been toggled (in operations 1843 or 1743) but is required if it has not been toggled. If the bit state is set (at 1) as determined in 1903, then the status of down current flag is checked in 1905 and if yes in 1905, the bias voltage is checked in 1907 to see if the bias voltage across the bit has changed to negative, necessitating a change in the bit conductance parameters to the high resistance state up values in operation 1909. Also in operation 1909, the down current flag is set (to 1).

If the down current flag is not set in 1905, then the model determines whether the bias voltage is positive in diamond 1911, and if yes in 1911, resets the down current flag (to zero) and sets the conductance parameters to the high resistive state down values in operation 1913.

If no in diamond 1903, if no in 1907, if no in diamond 1911, after operation 1909, or after operation 1913, the model performs operation 1915. In operation 1915, if there has been a change in conductance parameter values during the present iteration or previous iterations for a preset simulation time period (e.g. a 100 picoseconds of simulation time) the model does a transition between parameter values over time to prevent sudden changes in the conductance values for the simulation.

Finally, the current through the MTJ is calculated from the voltage using the conductance parameter values and capacitance models (not shown in the FIGS.) in operation 1917. The conductance parameter values utilized depends upon the most recent conductance values set and the transition simulation performed in 1915 if the parameters were changed during recent iterations. After the MTJ current is calculated, control is returned in 1919 to other portions of the simulation.

In one embodiment, the flow set forth in FIGS. 13-19 may be implemented in VERILOG-A. In other embodiments, the model may have other configurations and/or other implementations.

Although the Tables and flow charts described herein describe a model that checks for magnetic pulses crossing thresholds, a model made be based upon calculated current through the write lines crossing equivalent thresholds in other embodiments. With some of these parameters, the conductance coefficients would be scaled accordingly.

Figure 20:
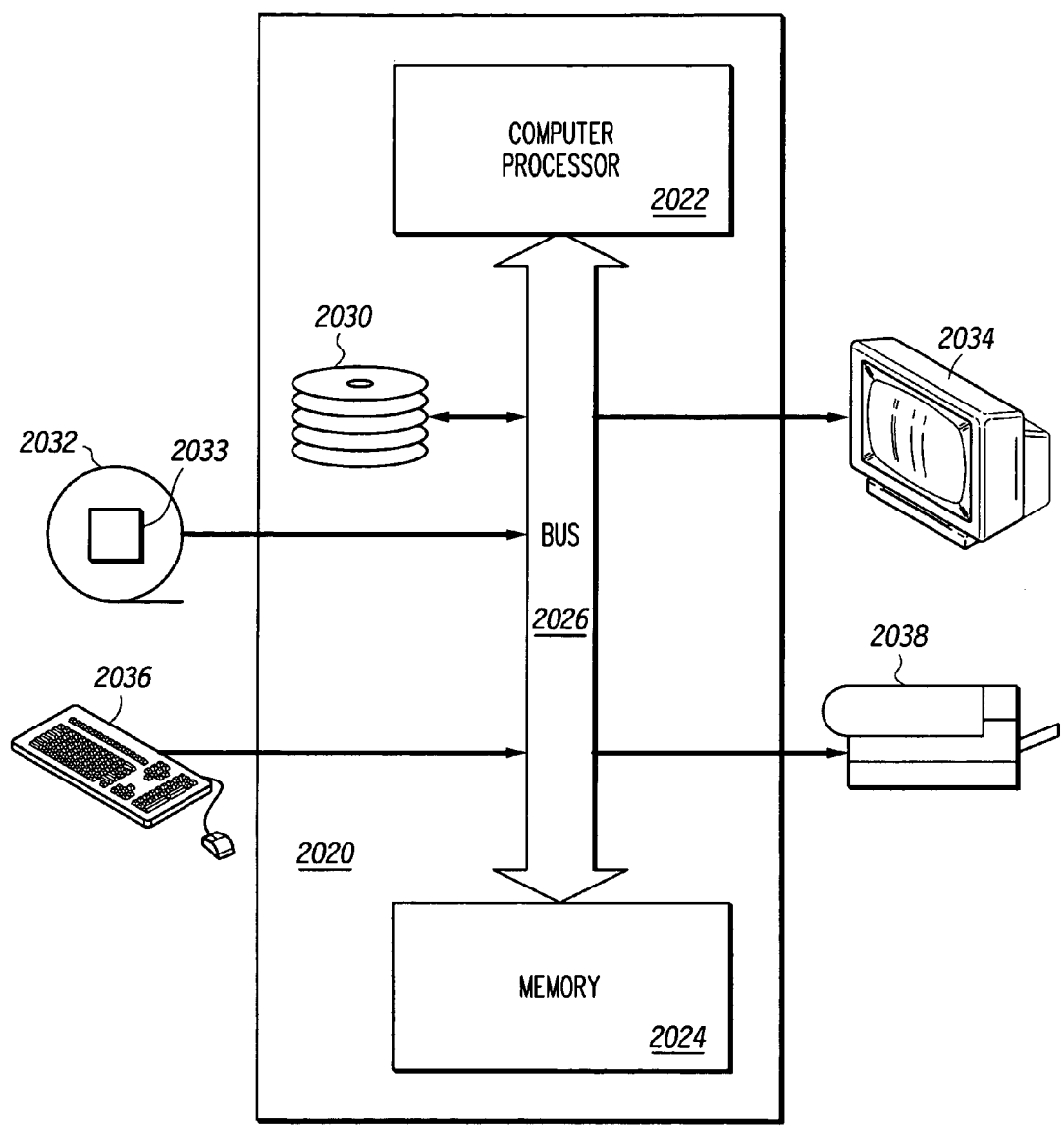
FIG. 20 is a block diagram of one embodiment of a computer according to the present invention.

FIG. 20 is a block diagram of a computer 2020 in accordance with one embodiment of the present invention which may be used to execute the methods discussed herein. Computer 2020 includes a computer processor 2022 and memory 2024 operably coupled by a bus 2026. Memory 2024 may include relatively high speed machine readable media such as DRAM, SRAM, ROM, FLASH, EEPROM, bubble memory, etc. Also operably coupled to bus 2026 are secondary storage 2030, external storage 2032, output devices such as a monitor 2034, input devices such as a keyboard (with mouse) 2036, and printers 2038. Secondary storage 2030 may include machine readable media such as hard disk drives, magnetic drum, bubble memory, etc. External storage 2032 may include machine readable media such as floppy disks, removable hard drives, magnetic tap, CD-ROM, and even other computers, possibly coupled via a communications line. It should be appreciated that there may be overlap between some elements, such as between secondary storage 2030 and external storage 2032. Executable versions of computer software 2033, such as, for example, software for performing the MRAM simulation described herein, can be written to, and later read from external storage 2032, loaded for execution into memory 2024, or stored on secondary storage 2030 prior to loading into memory 2024 and execution. Also, the MRAM cell simulation model may be stored in secondary storage 2030 or external storage 2032.

In the foregoing specification, the invention has been described with reference to specific embodiments. However, one of ordinary skill in the art appreciates that various modifications and changes can be made without departing from the scope of the present invention as set forth in the claims below. For example, any software taught herein may be embodied on one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the flow diagrams may also be arranged differently, include more or less operations, be arranged differently, or may have operations that can be separated into multiple operations that can be performed simultaneously with one another. Accordingly, the specification and figures are to be regarded in an illustrative rather than a restrictive sense, and all such modifications are intended to be included within the scope of present invention.

In one embodiment, the invention includes a method for simulating a magnetoresistive memory device of a magnetoresistive random access memory (MRAM) having a first conductor, a second conductor, and a magnetic tunnel junction (MTJ). The first conductor is disposed substantially orthogonal to the second conductor. The MTJ is disposed between the first conductor and the second conductor. The method includes calculating a first current in the first conductor, calculating a second current in the second conductor, and detecting an indication of a transition of one of the first current and the second current across a threshold. The method also includes modifying a status of an operating condition of a plurality of operating conditions in response to the detecting the indication of the transition and outputting a bit state that is dependent upon a status of the plurality of operating conditions.

In another embodiment, the invention includes a method of simulating a memory device of a magnetoresistive random access memory (MRAM). The memory device has a magnetic tunnel junction (MTJ) with multiple free magnetic layers. The method includes calculating an indication of a first magnetic field applied to the MTJ, calculating an indication of a second magnetic field applied to the MTJ, and detecting an indication of a transition of one of the first magnetic field and the second magnetic field across a threshold. The method also includes modifying a status of an operating condition of a plurality of operating conditions in response to the detecting the indication of a transition and providing an output bit state for the memory device. The output bit state is dependent upon a status of the plurality of operating conditions.

In another embodiment, the invention includes a method for simulating a magnetoresistive memory device in an integrated circuit magnetoresistive random access memory (MRAM) having a first conductor, a second conductor, and a magnetic tunnel junction (MTJ). The first conductor is disposed substantially orthogonal to the second conductor. The MTJ is disposed between the first conductor and the second conductor. The method includes calculating an indication of a first magnetic field applied to the MTJ. The first magnetic field is generated by current in the first conductor. The method also includes calculating an indication of a second magnetic field applied to the MTJ. The second magnetic field is generated by current in the second conductor. The method further includes detecting indications of transitions of the first magnetic field and the second magnetic field across one or more thresholds and providing a state machine having one or more state variables with transitions in the state machine being dependent upon detected indications of transitions of the first magnetic field and the second magnetic field and a state of the one or more state variables.

In another embodiment, the invention includes a computer readable medium having stored instructions for simulating a magnetoresistive memory device of a magnetoresistive random access memory (MRAM) including a first conductor, a second conductor, and a magnetic tunnel junction (MTJ). The first conductor is disposed substantially orthogonal to the second conductor. The MTJ is disposed between the first conductor and the second conductor. The MTJ has multiple free magnetic layers. The computer readable medium includes instructions for calculating an indication of a first magnetic field applied to the MTJ. The first magnetic field being generated by current in the first conductor. The computer readable medium includes instructions for calculating an indication of a second magnetic field applied to the MTJ. The second magnetic field is generated by current in the second conductor. The computer readable medium includes instructions for detecting indications of transitions of the first magnetic field and the second magnetic field across one or more thresholds and instructions for modifying a status of operating conditions in response to detecting the indications of transitions of one of the first magnetic field and the second magnetic field across one or more thresholds. The computer readable medium also includes instructions for outputting a bit state that is dependent upon the status of the operating conditions.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for simulating a magnetoresistive memory device in an integrated circuit magnetoresistive random access memory (MRAM) having a first conductor, a second conductor, and a magnetic tunnel junction (MTJ), the first conductor disposed substantially orthogonal to the second conductor, the MTJ disposed between the first conductor and the second conductor, the method comprising:
    calculating an indication of a first magnetic field applied to the MTJ, the first magnetic field generated by current in the first conductor;
    calculating an indication of a second magnetic field applied to the MTJ, the second magnetic field generated by current in the second conductor;
    detecting indications of transitions of the first magnetic field and the second magnetic field across one or more thresholds; and
    providing a state machine having one or more state variables with transitions in the state machine being dependent upon detected indications of transitions of the first magnetic field and the second magnetic field and a state of the one or more state variables, wherein state variables of the state machine include:
        a state variable indicative of a presence of the first magnetic field above a predetermined threshold;
        a state variable indicative of a presence of the second magnetic field above a predetermined threshold;
        a state variable indicative of a presence of the first magnetic field above a predetermined threshold preceding a presence of the second magnetic field above a predetermined threshold; and
        a state variable indicative of a presence of the second magnetic field above a predetermined threshold preceding a presence of the first magnetic field above a predetermined threshold.

2. The method of claim 1 further comprising:
modeling a conductance value of the MTJ in each of two bit states by using an equation having an equivalent form of $G(A+BV+CV^2)$, where G is a conductance value of the MTJ, A, B, and C are zero, first, and second order voltage coefficient parameters, and V is a MTJ bias voltage value.

3. The method of claim 2 further comprising:
utilizing a first set of zero, first, and second order voltage coefficient parameters for the conductance value for a first bit state and utilizing a second set of zero, first, and second order voltage coefficient parameters for the conductance value for a second bit state.

4. The method of claim 2 further comprising
in at least one of the two bit states, utilizing a first set of zero, first, and second order voltage coefficient parameters for the conductance value for a positive MTJ bias voltage and utilizing a second set of zero, first, and second order voltage coefficient parameters for the conductance value for a negative MTJ bias voltage.

5. The method of claim 2 further comprising:
calculating A, B, and C as a function of temperature.

6. The method of claim 2 wherein values of G, A, B, and C are generated by a method comprising:
fitting low resistance state conductance data, high resistance state conductance negative bias voltage data, and high resistance state conductance positive bias voltage data for predetermined temperatures with second order polynomials; and
fitting individual polynomial coefficient parameters to first order temperature polynomials.

7. The method of claim 6 wherein the values of G, A, B, and C are generated by a method further comprising:
adjusting one or more of the individual polynomial coefficient parameters to minimize a total error being measured between the second order polynomials and each of the low resistance state conductance data, the high resistance state conductance negative bias voltage data, and the high resistance state conductance positive bias voltage data.

8. The method of claim 7 wherein the values of G, A, B, and C are generated by a method further comprising:
eliminating one or more of the polynomial coefficient parameters which have a minimal effect on error being measured.

9. The method of claim 1 wherein the MTJ includes multiple free magnetic layers.

10. The method of claim 1 wherein the one or more thresholds include:
    a first threshold corresponding to the first magnetic field exceeding a lower threshold while increasing;
    a second threshold corresponding to the first magnetic field exceeding a higher threshold while increasing;
    a third threshold corresponding to the second magnetic field exceeding a lower threshold while increasing;
    a fourth threshold corresponding to the second magnetic field exceeding a upper threshold while increasing.

11. The method of claim 1 wherein:
    the calculating an indication of a first magnetic field applied to the MTJ further includes calculating a first current in the first conductor;
    the calculating an indication of a second magnetic field applied to the MTJ further includes calculating a second current in the second conductor.

* * * * *